United States Patent
Misaki

(10) Patent No.: US 11,804,503 B2
(45) Date of Patent: Oct. 31, 2023

(54) PHOTOELECTRIC CONVERSION DEVICE AND X-RAY IMAGING DEVICE

(71) Applicant: SHARP KABUSHIKI KAISHA, Sakai (JP)

(72) Inventor: Katsunori Misaki, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 226 days.

(21) Appl. No.: 17/340,439

(22) Filed: Jun. 7, 2021

(65) Prior Publication Data

US 2021/0391360 A1 Dec. 16, 2021

Related U.S. Application Data

(60) Provisional application No. 63/038,306, filed on Jun. 12, 2020.

(51) Int. Cl.
*H01L 27/146* (2006.01)
*H01L 31/105* (2006.01)

(52) U.S. Cl.
CPC .... *H01L 27/1462* (2013.01); *H01L 27/14603* (2013.01); *H01L 27/14663* (2013.01); *H01L 27/14685* (2013.01); *H01L 27/14692* (2013.01); *H01L 27/1461* (2013.01); *H01L 27/14612* (2013.01); *H01L 31/1055* (2013.01)

(58) Field of Classification Search
CPC .......... H01L 27/1462; H01L 27/14603; H01L 27/14663; H01L 27/14685; H01L 27/14692; H01L 27/1461; H01L 27/14612; H01L 27/14636; H01L 31/1055; H01L 31/0203; H01L 31/02161
See application file for complete search history.

(56) References Cited

U.S. PATENT DOCUMENTS

| | | | | |
|---|---|---|---|---|
| 5,288,989 A | * | 2/1994 | Ishaque | H01L 31/107 257/E31.038 |
| 2007/0113886 A1 | | 5/2007 | Arao et al. | |
| 2013/0313667 A1 | * | 11/2013 | Homma | H01L 27/14663 257/428 |
| 2020/0003911 A1 | * | 1/2020 | Nara | G01T 1/2018 |

FOREIGN PATENT DOCUMENTS

| | | | | |
|---|---|---|---|---|
| CN | 104768758 A | * | 7/2015 | ............... B05D 1/60 |
| JP | 2007165865 A | | 6/2007 | |

* cited by examiner

*Primary Examiner* — Sitaramarao S Yechuri
(74) *Attorney, Agent, or Firm* — ScienBiziP, P.C.

(57) ABSTRACT

A photoelectric conversion device includes: a substrate; a photoelectric conversion element provided on the substrate; a first protective layer provided on the photoelectric conversion element; and a second protective layer provided above the substrate and surrounding the photoelectric conversion element and the first protective layer, the second protective layer being lower in water vapor transmittance than the first protective layer. The second protective layer has an upper end positioned above an upper end of the first protective layer.

20 Claims, 16 Drawing Sheets

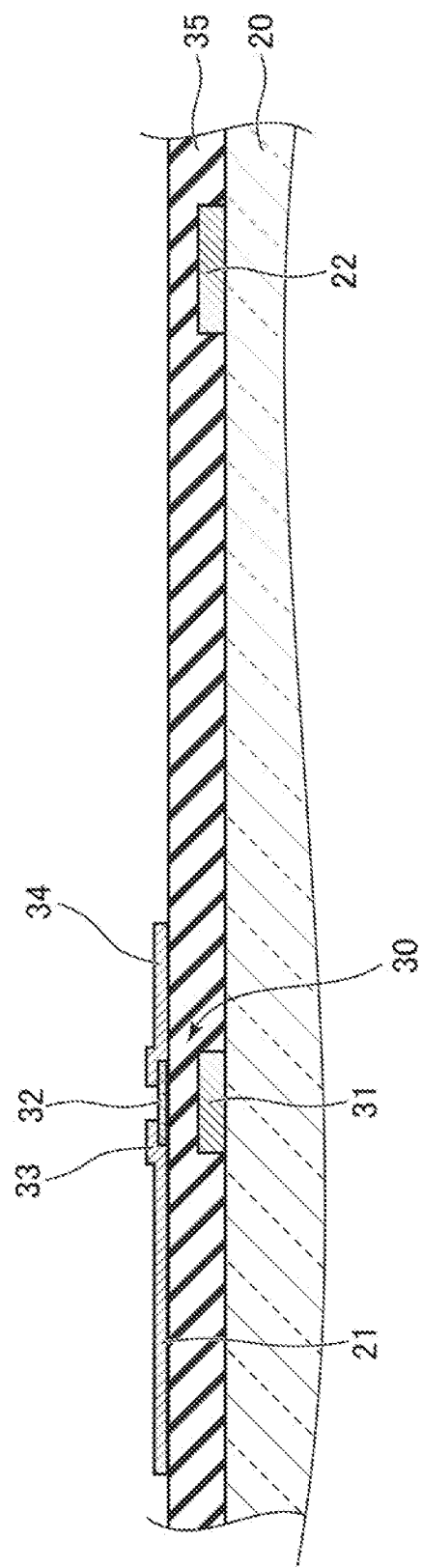

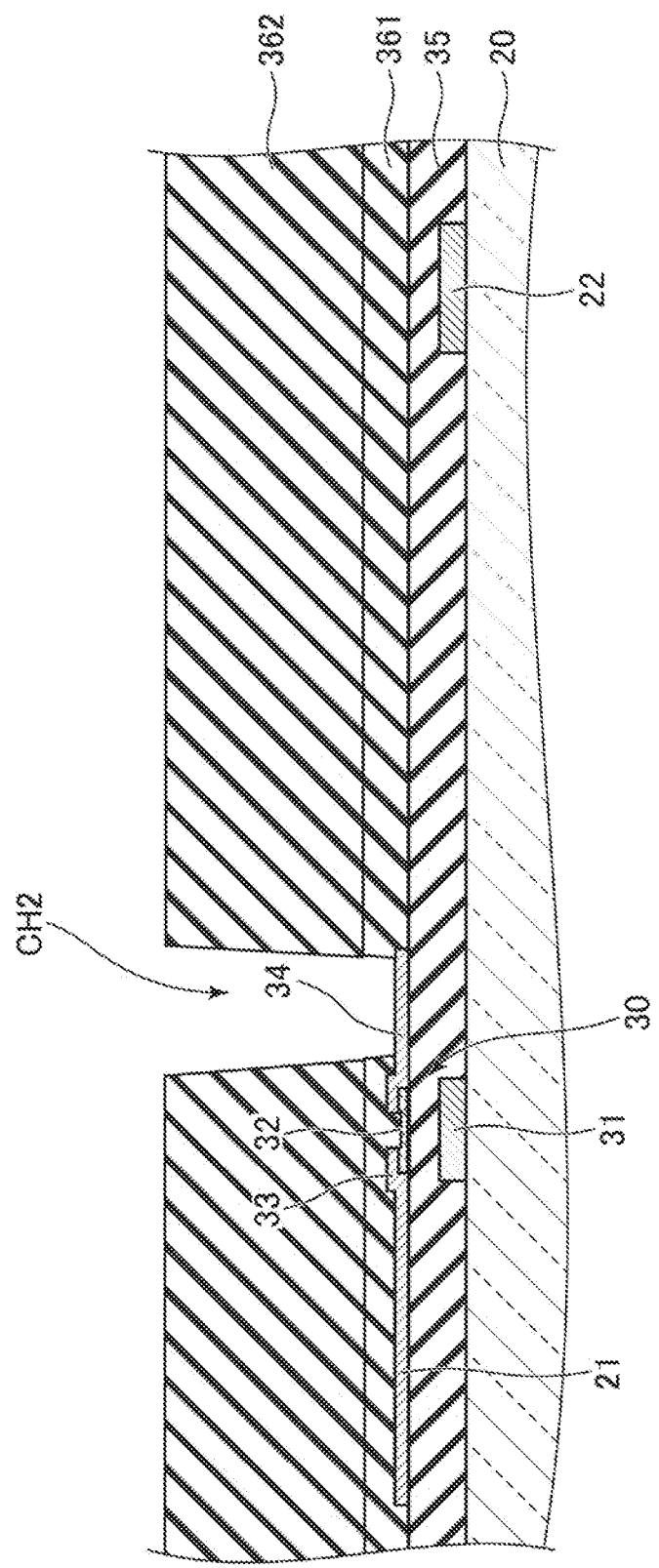

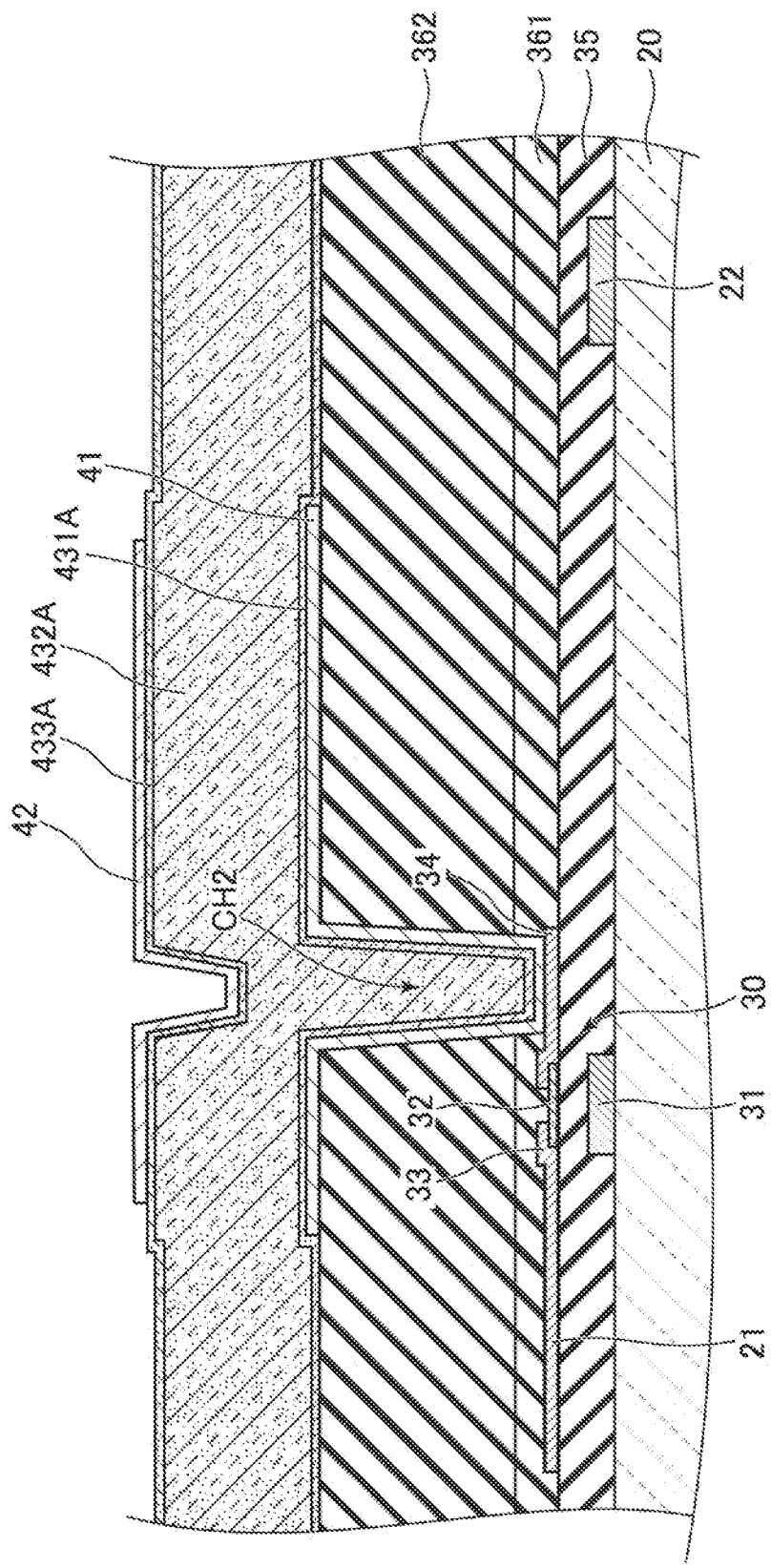

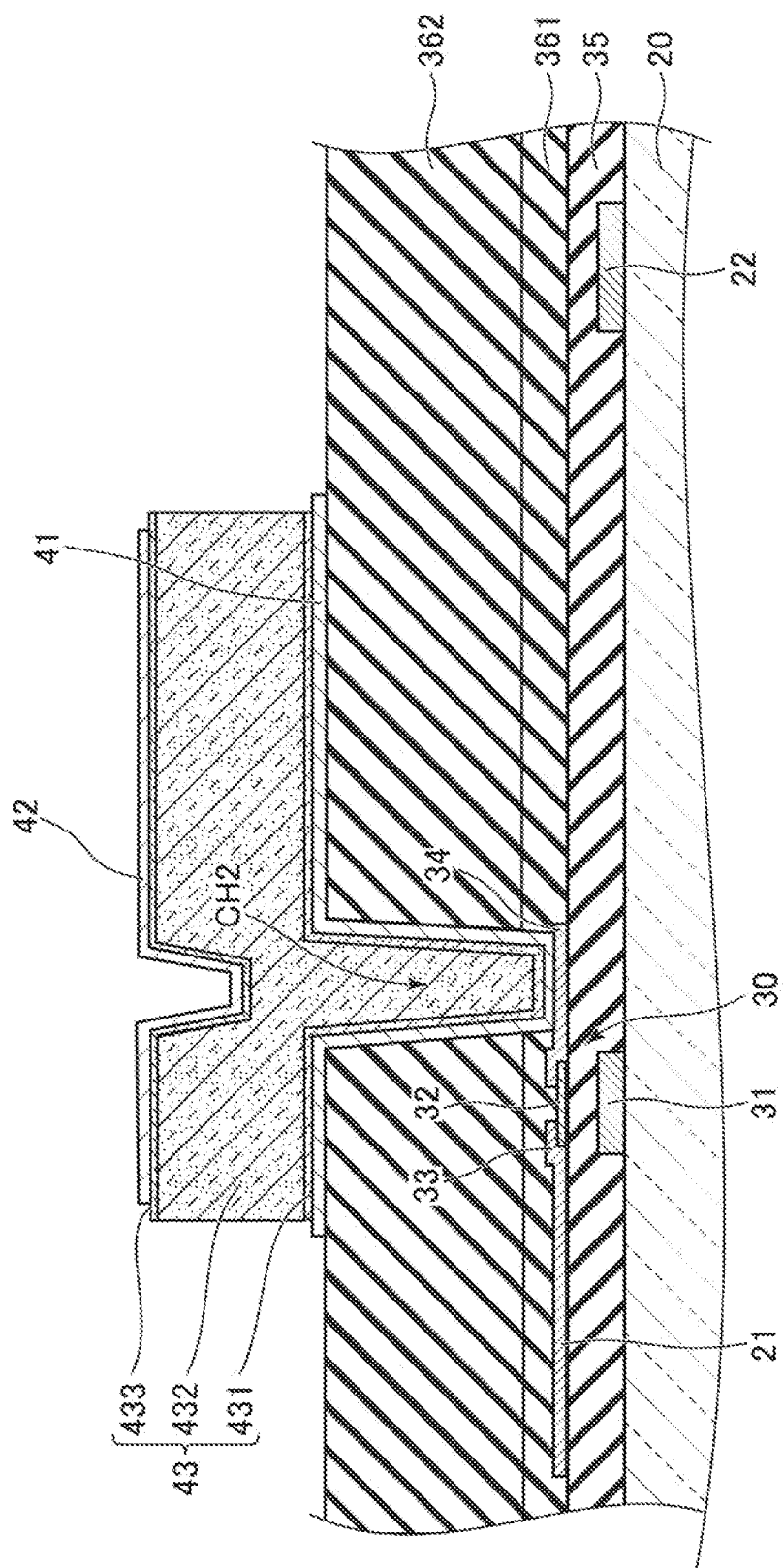

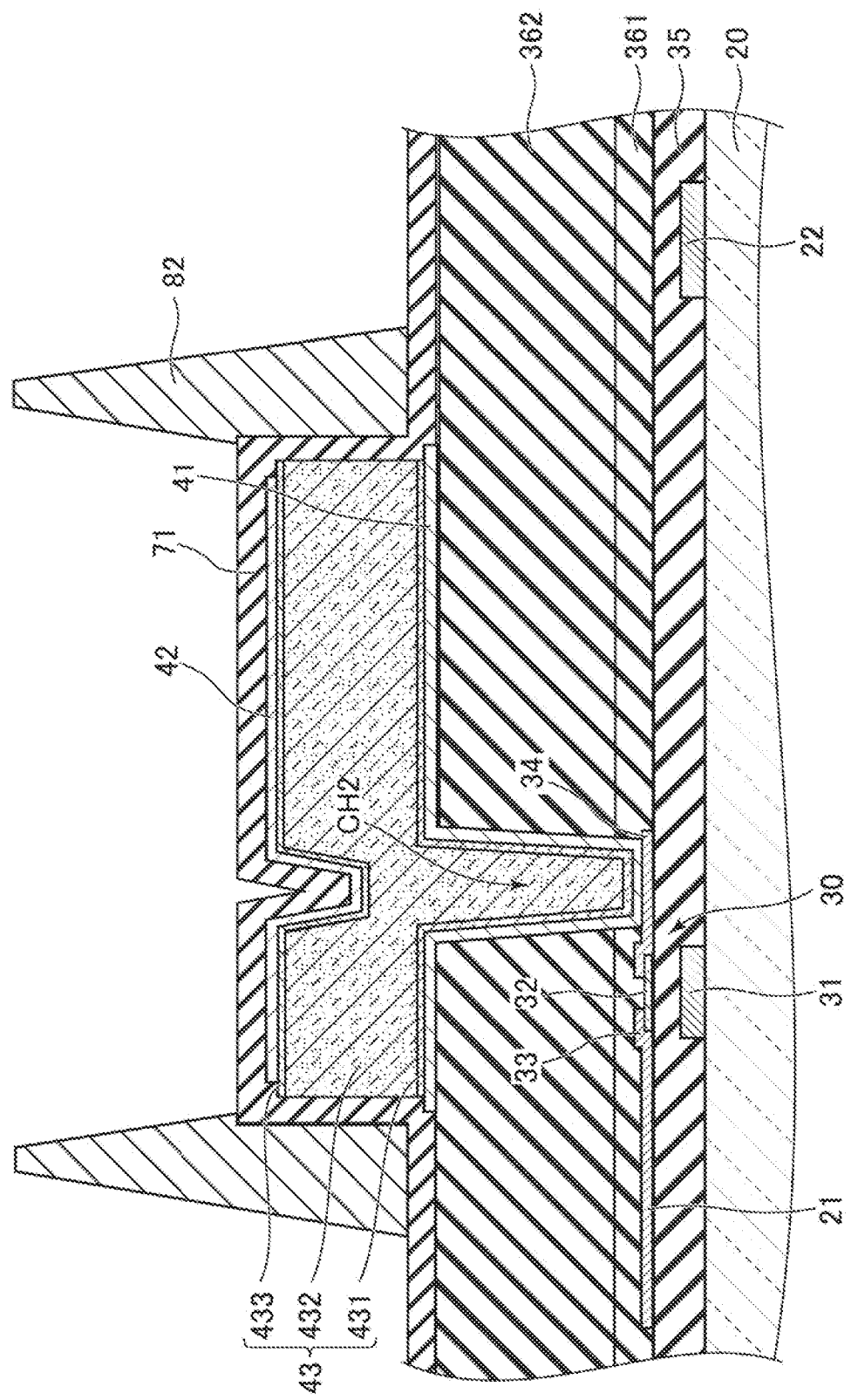

PHOTOELECTRIC CONVERSION DEVICE AND X-RAY IMAGING DEVICE

CROSS-REFERENCE TO RELATED APPLICATION

The present application claims priority from Provisional Application No. 63/038,306, the content to which is hereby incorporated by reference into this application.

BACKGROUND OF THE INVENTION

1. Field of the Invention

The disclosure relates to a photoelectric conversion device and an X-ray imaging device.

2. Description of the Related Art

Japanese Unexamined Patent Application Publication No. 2007-165865 discloses an example of a photoelectric conversion device provided with an active-matrix substrate including pixels each having a photoelectric conversion element connected to a switching element. The photoelectric conversion device described in Japanese Unexamined Patent Application Publication No. 2007-165865 includes a thin-film transistor (hereinafter referred to as TFT) as the switching element. The photoelectric conversion element includes: such semiconductor layers as a p-type semiconductor layer, an i-type semiconductor layer, and an n-type semiconductor layer, and an electrode connected to each of the p-type semiconductor layer and the n-type semiconductor layer. The photoelectric conversion element is covered with a resin film made of epoxy resin.

SUMMARY

A photoelectric conversion device such as the one described in Japanese Unexamined Patent Application Publication No. 2007-165865 could develop a defect on the surface of the photoelectric conversion device during and after its production process. Such foreign objects as oxygen and water reach the inside of the photoelectric conversion device through the defect and cause current leakage in a photoelectric conversion element, resulting in a decrease in accuracy in light detection. Moreover, the foreign objects such as oxygen and water reaching the inside of the photoelectric conversion device move on the resin film and diffuse into adjoining photoelectric conversion elements, causing a decrease in detection accuracy of the adjoining photoelectric conversion elements. Consequently, the photoelectric conversion device suffers a decrease in reliability.

An embodiment of the disclosure is directed to a photoelectric conversion device, and is intended to provide a technique to keep such foreign objects as oxygen and water, reaching the inside of the photoelectric conversion device, from diffusing into adjoining photoelectric conversion elements, thereby improving reliability of the photoelectric conversion device.

(1) A photoelectric conversion device of the disclosure includes: a substrate; a photoelectric conversion element provided on the substrate; a first protective layer provided on the photoelectric conversion element; and a second protective layer provided above the substrate and surrounding the photoelectric conversion element and the first protective layer, the second protective layer being lower in water vapor transmittance than the first protective layer. The second protective layer has an upper end positioned above an upper end of the first protective layer.

(2) The photoelectric conversion device according to the above item (1) further includes an inorganic insulating layer provided on the photoelectric conversion element. The first protective layer includes a first resin layer.

(3) In the photoelectric conversion device according to the above item (2), the inorganic insulating layer includes a first inorganic insulating layer covering a side face and an upper face of the photoelectric conversion element, and the first resin layer is provided on the first inorganic insulating layer.

(4) In the photoelectric conversion device according to the above item (3), a side face of the second protective layer and the first inorganic insulating layer covering the side face of the photoelectric conversion element are in contact with each other.

(5) In the photoelectric conversion device according to any one of the above items (2) to (4), the second protective layer includes a second inorganic insulating layer covering a second resin layer, and at least partially covering a surface of the second resin layer.

(6) In the photoelectric conversion device according to the above item (5), the inorganic insulating layer includes a third inorganic insulating layer integrally formed together with the second inorganic insulating layer.

(7) In the photoelectric conversion device according to any one of the above items (2) to (6), the photoelectric conversion element includes: a lower electrode; an upper electrode; and a photoelectric conversion layer provided between the lower electrode and the upper electrode. The photoelectric conversion device further includes: a thin-film transistor provided on the substrate and electrically connected to the lower electrode; a connector electrically connected to the upper electrode through a contact hole provided to the first protective layer and the inorganic insulating layer; and a wire layer electrically connected to the connector.

(8) In the photoelectric conversion device according to the above item (7), the connector is in contact with the inorganic insulating layer in the contact hole.

(9) In the photoelectric conversion device according to the above item (7) or (8), the photoelectric conversion layer includes: an n-type semiconductor layer; an i-type semiconductor layer, and a p-type semiconductor layer stacked on top of another in a stated order.

(10) In the photoelectric conversion device according to the above item (9), the n-type semiconductor layer contains n-type amorphous silicon, the i-type semiconductor layer contains i-type amorphous silicon, and the p-type semiconductor layer contains p-type amorphous silicon.

(11) The photoelectric conversion device according to any one of the above items (1) to (10) further includes a third protective layer integrally formed to cover an upper face of the first protective layer and the upper end of the second protective layer.

(12) In the photoelectric conversion device according to the above item (11), the third protective layer includes a fourth inorganic insulating layer integrally formed to cover the upper face of the first protective layer and the upper end of the second protective layer.

(13) In the photoelectric conversion device according to the above item (12), the third protective layer further includes a third resin layer provided on the fourth inorganic insulating layer.

(14) In the photoelectric conversion device according to any one of the above items (1) to (13), the second protective layer has a horizontal width in cross-section narrower upwards from the substrate.

(15) In the photoelectric conversion device according to any one of the above items (1) to (14), the photoelectric conversion element includes a plurality of photoelectric conversion elements provided above the substrate, and the second protective layer is provided above the substrate, and surrounds each of the photoelectric conversion elements in top view.

(16) In the photoelectric conversion device according to the above item (15), regions each surrounded with the second protective layer are arranged in a matrix in top view.

(17) An X-ray imaging device includes: the photoelectric conversion device according to any one of the above items (1) to (16); and a scintillator provided on the photoelectric conversion device, and converting an X-ray, entering the scintillator, into fluorescent light.

An embodiment of the disclosure is directed to a photoelectric conversion device, and is capable of keeping such foreign objects as oxygen and water, reaching the inside of the photoelectric conversion device, from diffusing into adjoining photoelectric conversion elements, thereby improving reliability of the photoelectric conversion device.

BRIEF DESCRIPTION OF DRAWINGS

FIG. 5A is a cross-sectional view illustrating a process for producing the photoelectric conversion device according to the first embodiment.

FIG. 5C is a cross-sectional view illustrating a process for producing the photoelectric conversion device according to the first embodiment.

FIG. 5E is a cross-sectional view illustrating a process for producing the photoelectric conversion device according to the first embodiment.

FIG. 5F is a cross-sectional view illustrating a process for producing the photoelectric conversion device according to the first embodiment.

FIG. 5H is a cross-sectional view illustrating a process for producing the photoelectric conversion device according to the first embodiment.

FIG. 5I is a cross-sectional view illustrating a process for producing the photoelectric conversion device according to the first embodiment.

DETAILED DESCRIPTION

Described below are exemplary embodiments of the disclosure, with reference to the drawings. Note that the drawings include an X-axis and a Y-axis as a part thereof, and the directions of the axes are those that the drawings indicate. Moreover, vertical directions are indicated with reference to FIG. 4. The top and the bottom of FIG. 4 respectively indicate the upper side and the lower side. Note that these definitions of the directions are given simply for explanatory convenience, and are not intended to limit the directions of the photoelectric conversion device and the X-ray imaging device according to the disclosure when they are in production or in use. Moreover, identical reference signs are used to denote identical or substantially identical components throughout the drawings. Such components will not be repeatedly elaborated upon.

First Embodiment

Figure 1:
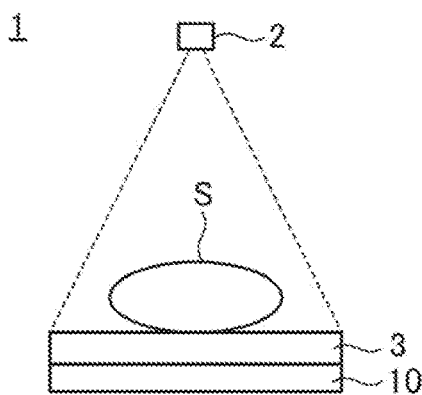
FIG. 1 is a schematic view briefly illustrating a configuration of an X-ray imaging device according to a first embodiment.

FIG. 1 is a schematic view briefly illustrating a configuration of an X-ray imaging device 1 including a photoelectric conversion device 10 according to this embodiment. The X-ray imaging device 1 captures a subject S with an X-ray. The X-ray imaging device 1 is used, for example, for such apparatuses as X-ray fluoroscopic apparatuses and X-ray CT scanners. The X-ray imaging device 1 of this embodiment includes: an X-ray source 2; a scintillator 3; and the photoelectric conversion device 10.

The X-ray source 2 emits an X-ray to the subject S. The X-ray enters the subject S, passes through the subject S. and enters the scintillator 3 provided on the photoelectric conversion device 10. The X-ray, entering the scintillator 3, is converted into fluorescent light (hereinafter referred to as scintillation light), and enters the photoelectric conversion device 10. The scintillation light entering the photoelectric conversion device 10 is converted, into charges depending on an amount of the light, by a photoelectric conversion element 40 included in the photoelectric conversion device 10. The converted charges are read out as an electric signal. The photoelectric conversion element 40 will be described later. After that, the photoelectric conversion device 10 generates an X-ray image in accordance with the electric signal.

Figure 2:
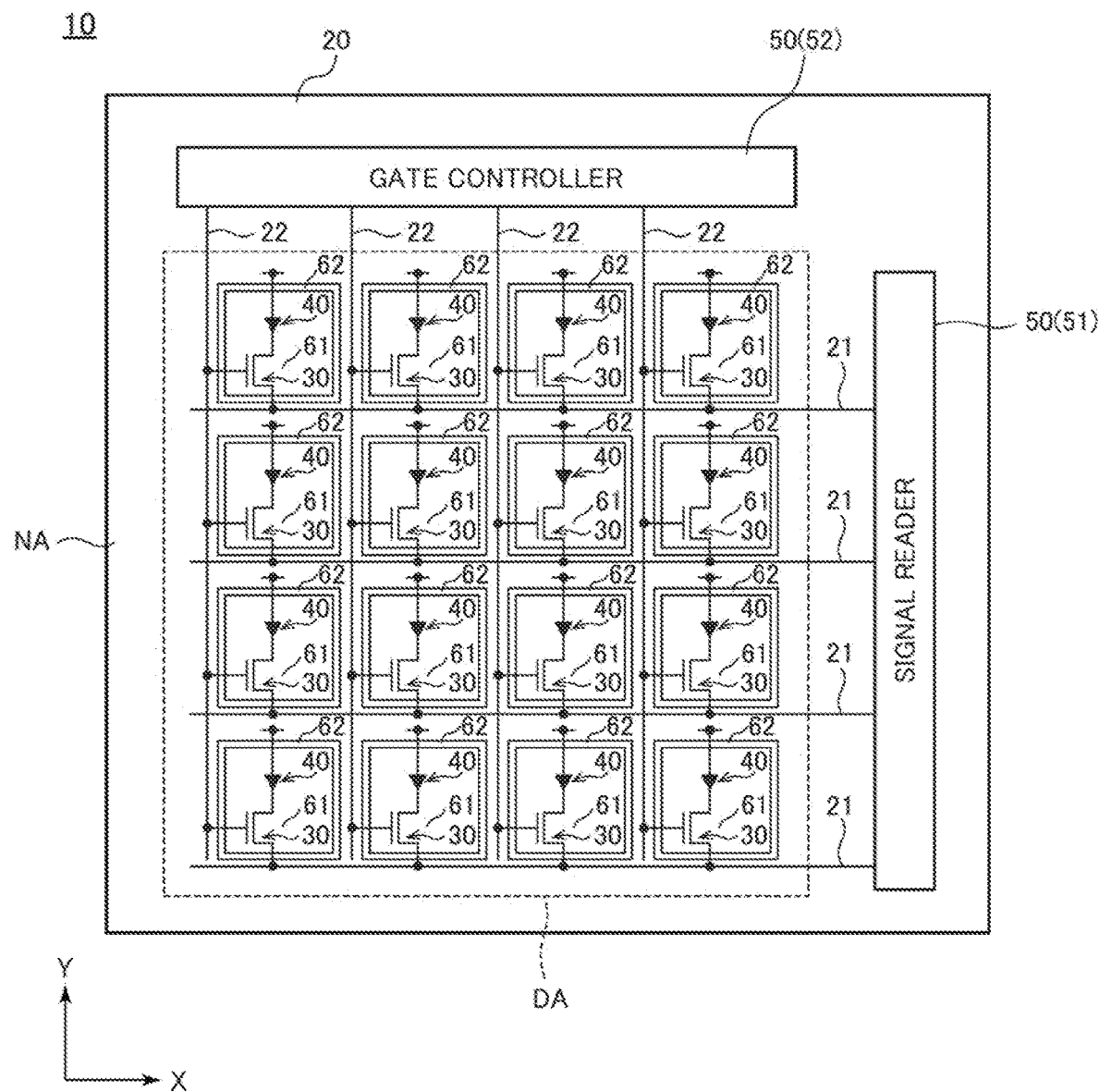
FIG. 2 is a top view briefly illustrating a configuration of a photoelectric conversion device according to the first embodiment.

Described next is a configuration of the photoelectric conversion device 10. FIG. 2 is a top view briefly illustrating a configuration of the photoelectric conversion device 10 according to the first embodiment. The photoelectric conversion device 10 according to this embodiment includes: a substrate 20; a TFT 30; the photoelectric conversion element 40; a controller 50; a first protective layer 61; and a second protective layer 62.

The substrate 20 is formed of, for example, such a material as glass. Provided on the substrate 20 are such components as the TFT 30, the photoelectric conversion element 40, the controller 50, the first protective layer 61, the second protective layer 62, and various kinds of wires. As illustrated in FIG. 2, a center region of the substrate 20 is an active region DA provided with the TFT 30 and the photoelectric conversion element 40. An outer region surrounding the active region DA of the substrate 20 is an inactive region (a frame region NA). The frame region NA includes the controller 50.

The controller 50 controls operations of various units in the photoelectric conversion device 10. The controller 50 includes a driver connected to the TFT 30 and the photoelectric conversion element 40. The driver includes: a signal reader 51 and a gate controller 52. The signal reader 51 is provided to the frame region NA of the substrate 20 in the X-direction. The gate controller 52 is provided to the frame region NA of the substrate 20 in the Y-direction.

Provided on the substrate 20 are a plurality of source wires 21 and a plurality of gate wires 22. The source wires 21 are provided across the active region DA along the X-direction. The gate wires 22 are provided across the active region DA along the Y-direction intersecting with the source wires 21. The TFT 30 serving as a switching element is provided near each of the intersections of the source wires 21 and the gate wires 22. Each of the source wires 21 has one end connected to the signal reader 51, and each of the gate wires 22 has one end connected to the gate controller 52.

Figure 3:
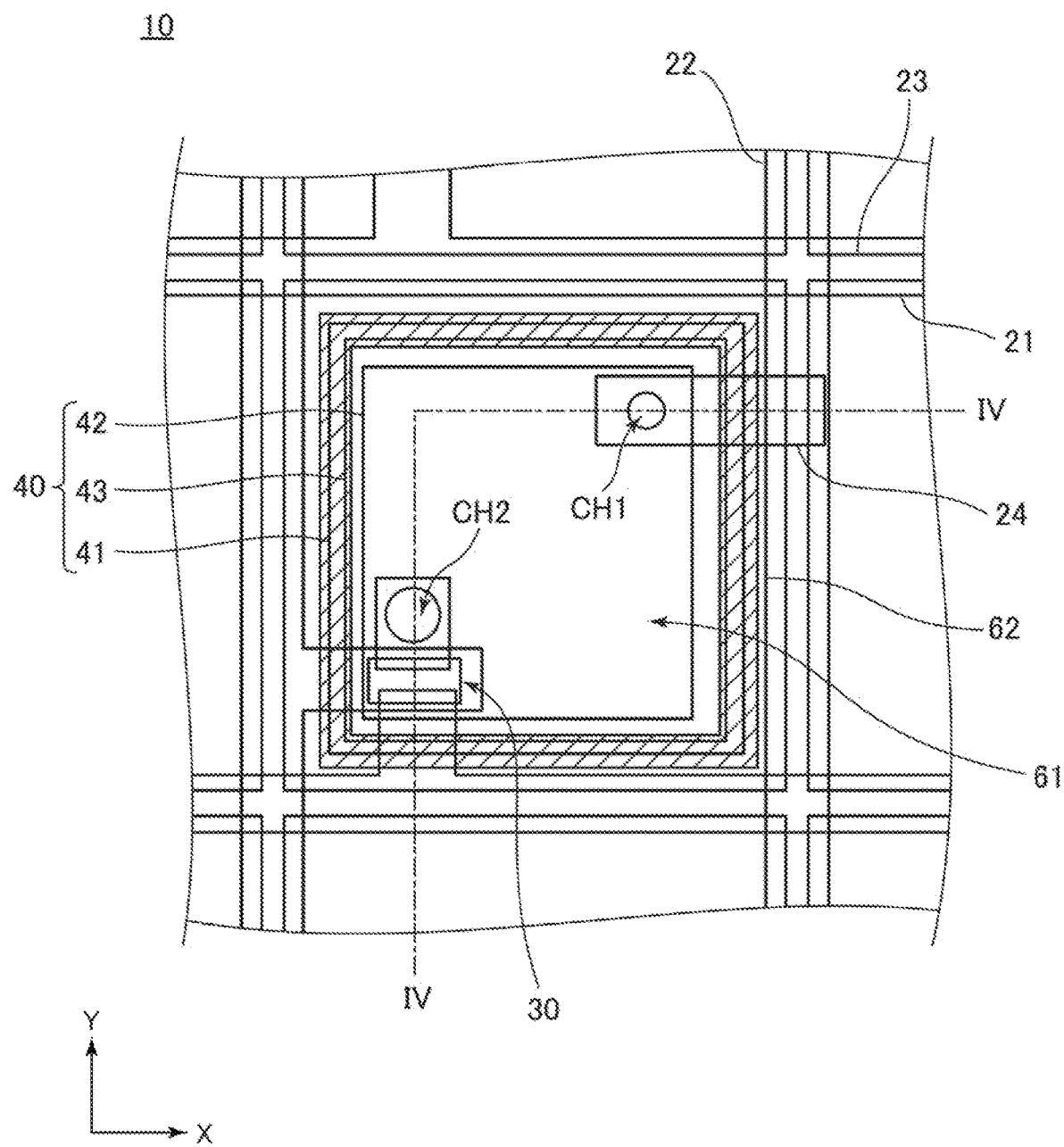
FIG. 3 is a top view partially illustrating a configuration of and around the photoelectric conversion element according to the first embodiment.

FIG. 3 is a top view partially illustrating a configuration of and around the photoelectric conversion element 40 according to this embodiment. As illustrated in FIG. 3, the TFT 30 and the photoelectric conversion element 40 of this embodiment are provided in a region surrounded with the source wires 21 and the gate wires 22 in top view. Moreover, a bias wire 23 is further provided on the substrate 20. The bias wire 23 is connected to the controller 50.

The bias wire 23 of this embodiment is provided above the substrate 20 to overlap the source wire 21 and the gate wire 22. That is, the TFT 30 and the photoelectric conversion element 40 of this embodiment are provided to a region surrounded with the bias wire 23. Moreover, the bias wire 23 is electrically connected to a connector 24. The connector 24 is electrically connected to the photoelectric conversion element 40 through a contact hole CH1. The controller 50 supplies a bias voltage through the bias wire 23 and the connector 24 to the photoelectric conversion element 40.

Figure 4:
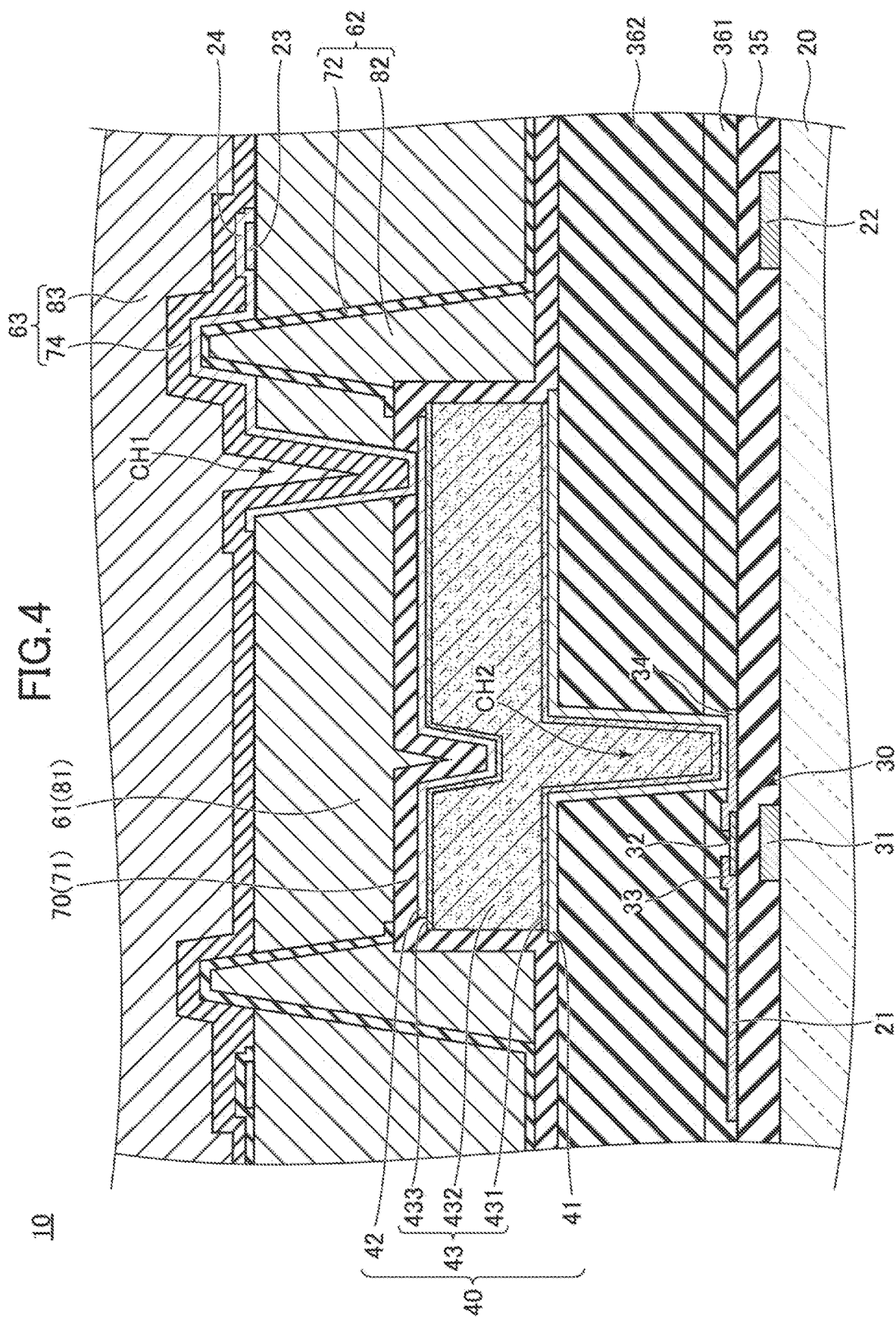
FIG. 4 is a cross-sectional view illustrating a configuration of and around the photoelectric conversion element according to the first embodiment.
Figure 5B:
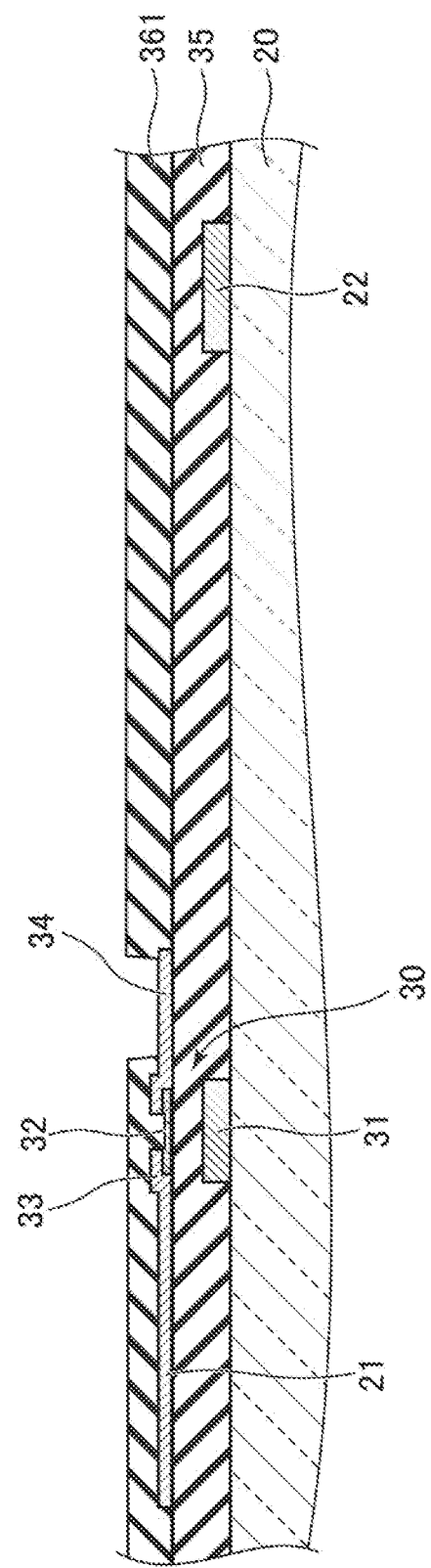
FIG. 5B is a cross-sectional view illustrating a process for producing the photoelectric conversion device according to the first embodiment.
Figure 5D:
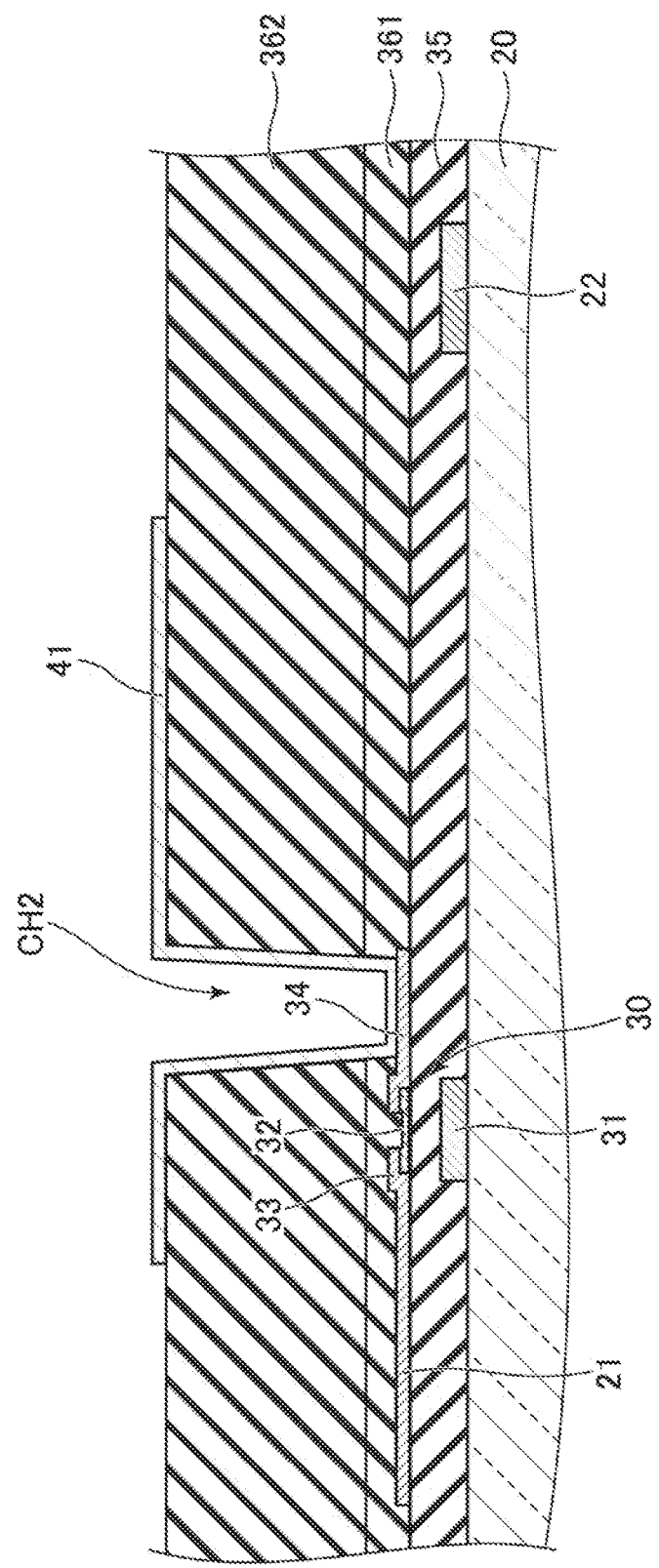
FIG. 5D is a cross-sectional view illustrating a process for producing the photoelectric conversion device according to the first embodiment.
Figure 5G:
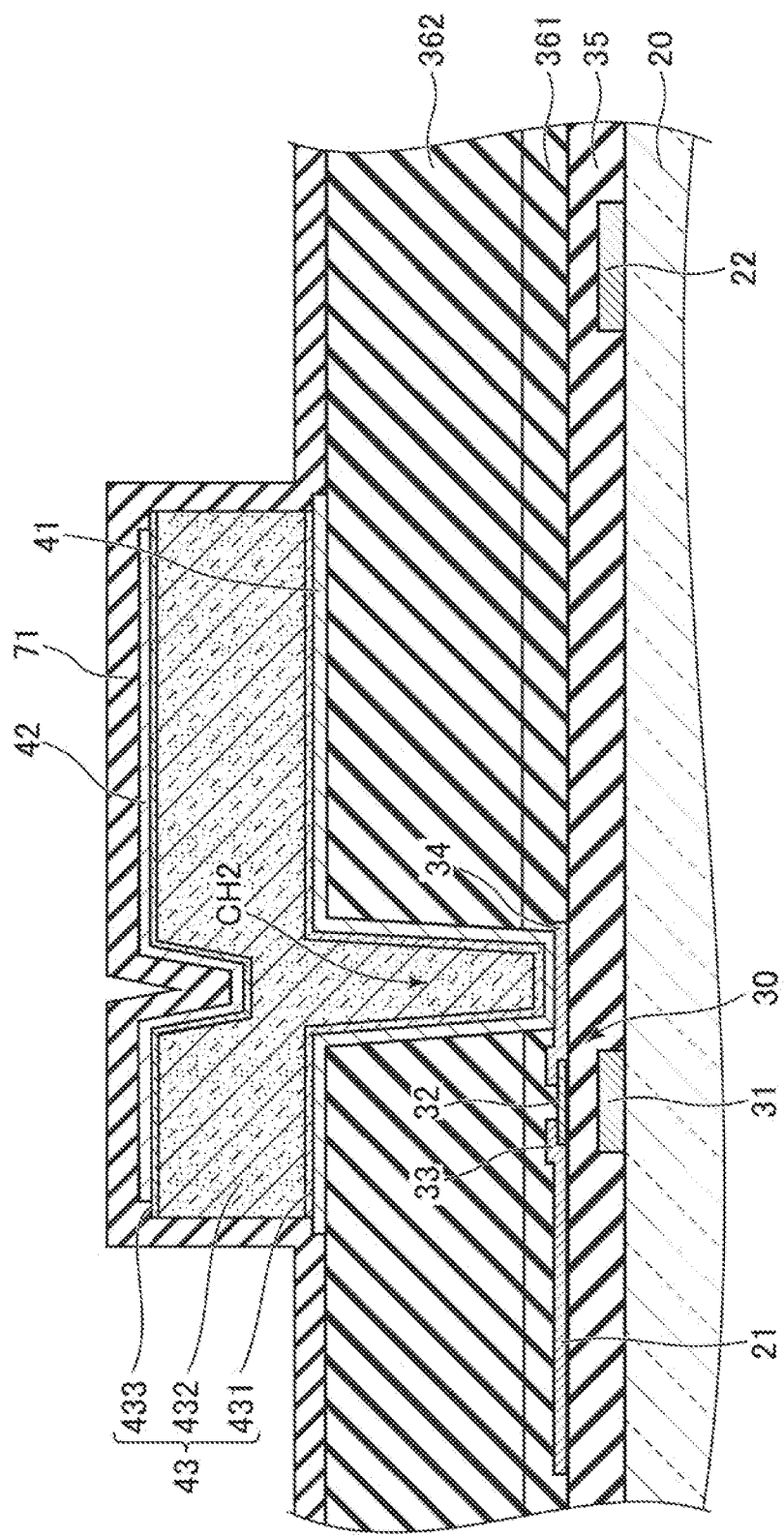
FIG. 5G is a cross-sectional view illustrating a process for producing the photoelectric conversion device according to the first embodiment.
Figure 51:
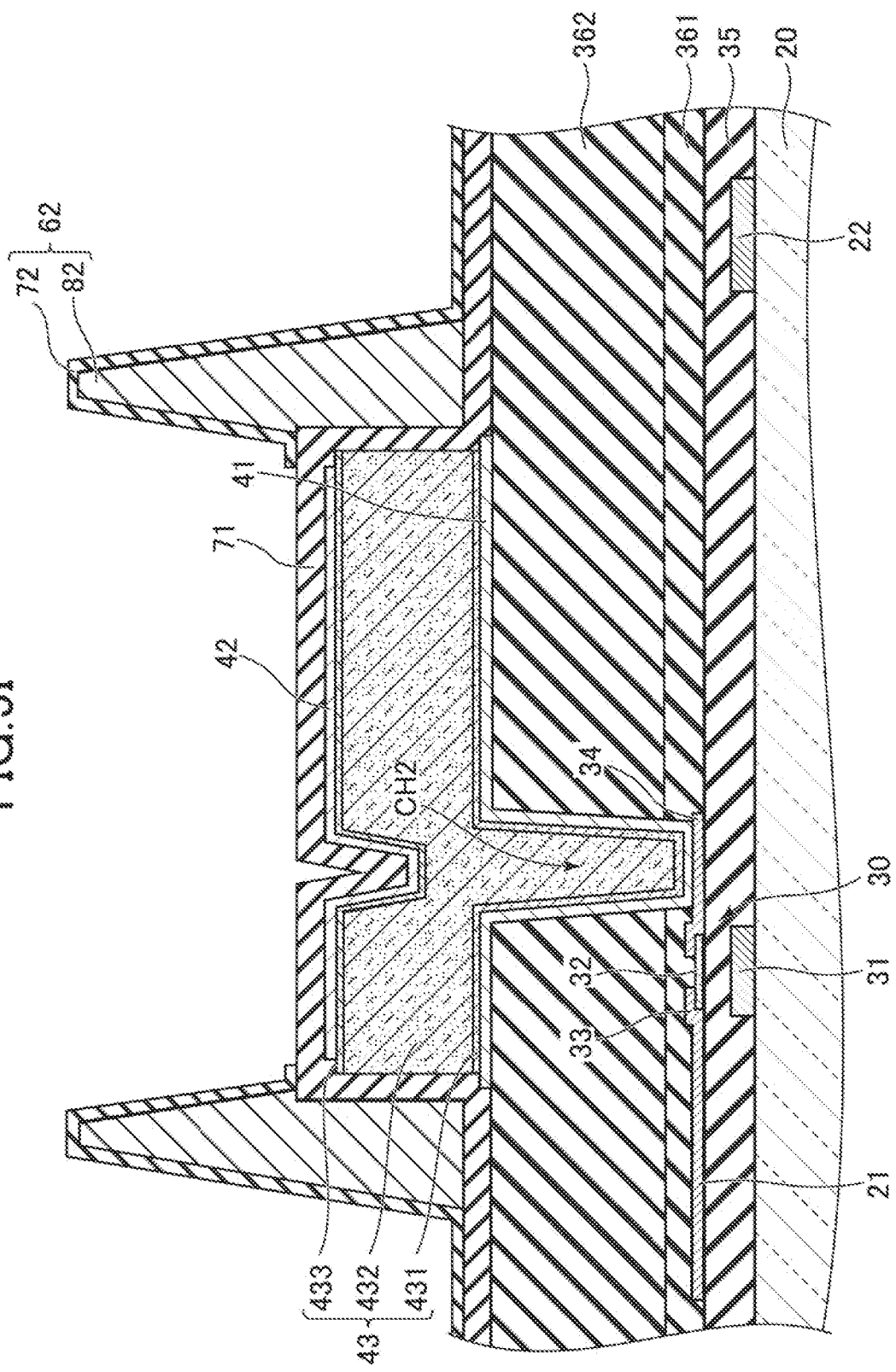
Figure 5J:
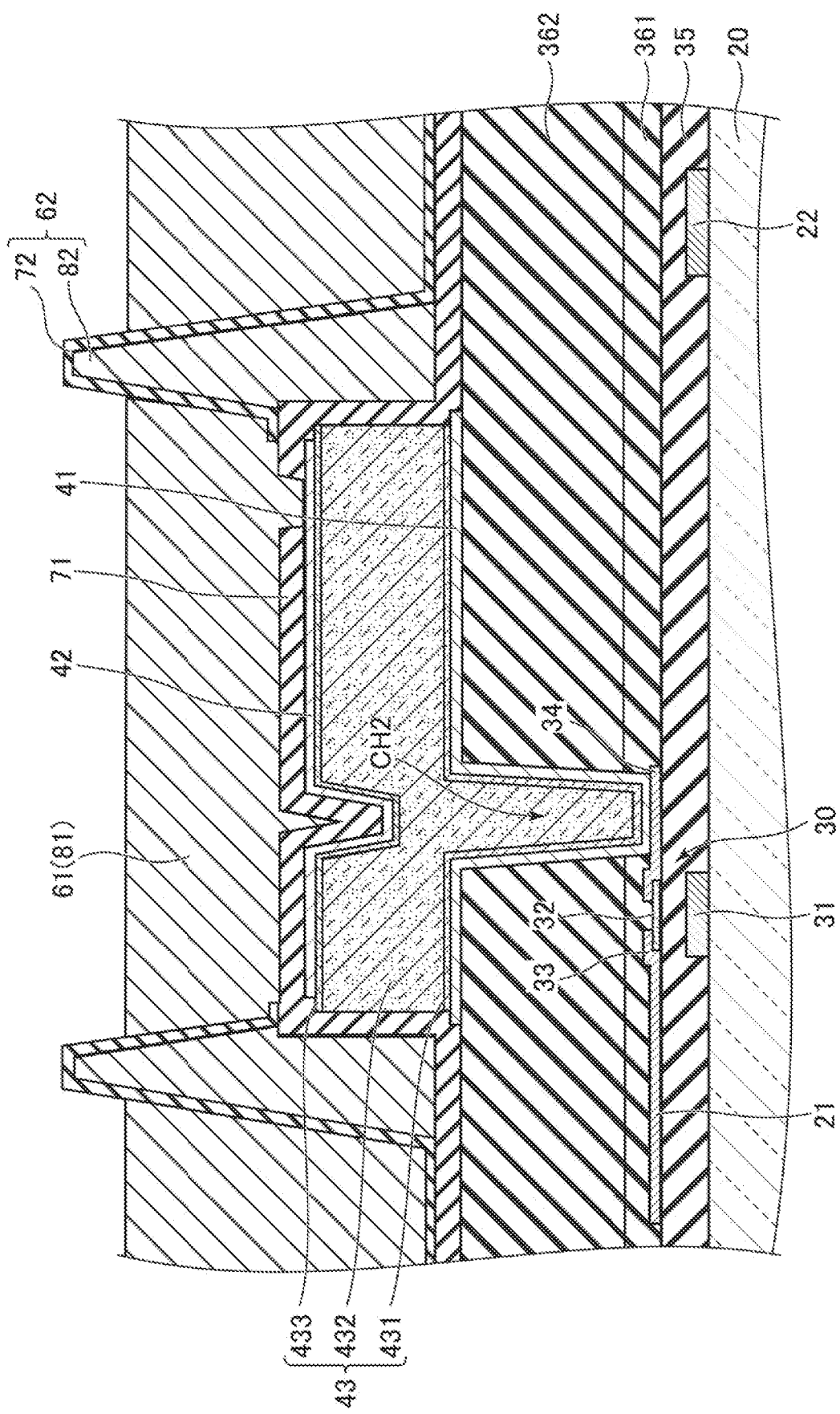
FIG. 5J is a cross-sectional view illustrating a process for producing the photoelectric conversion device according to the first embodiment.
Figure 5K:
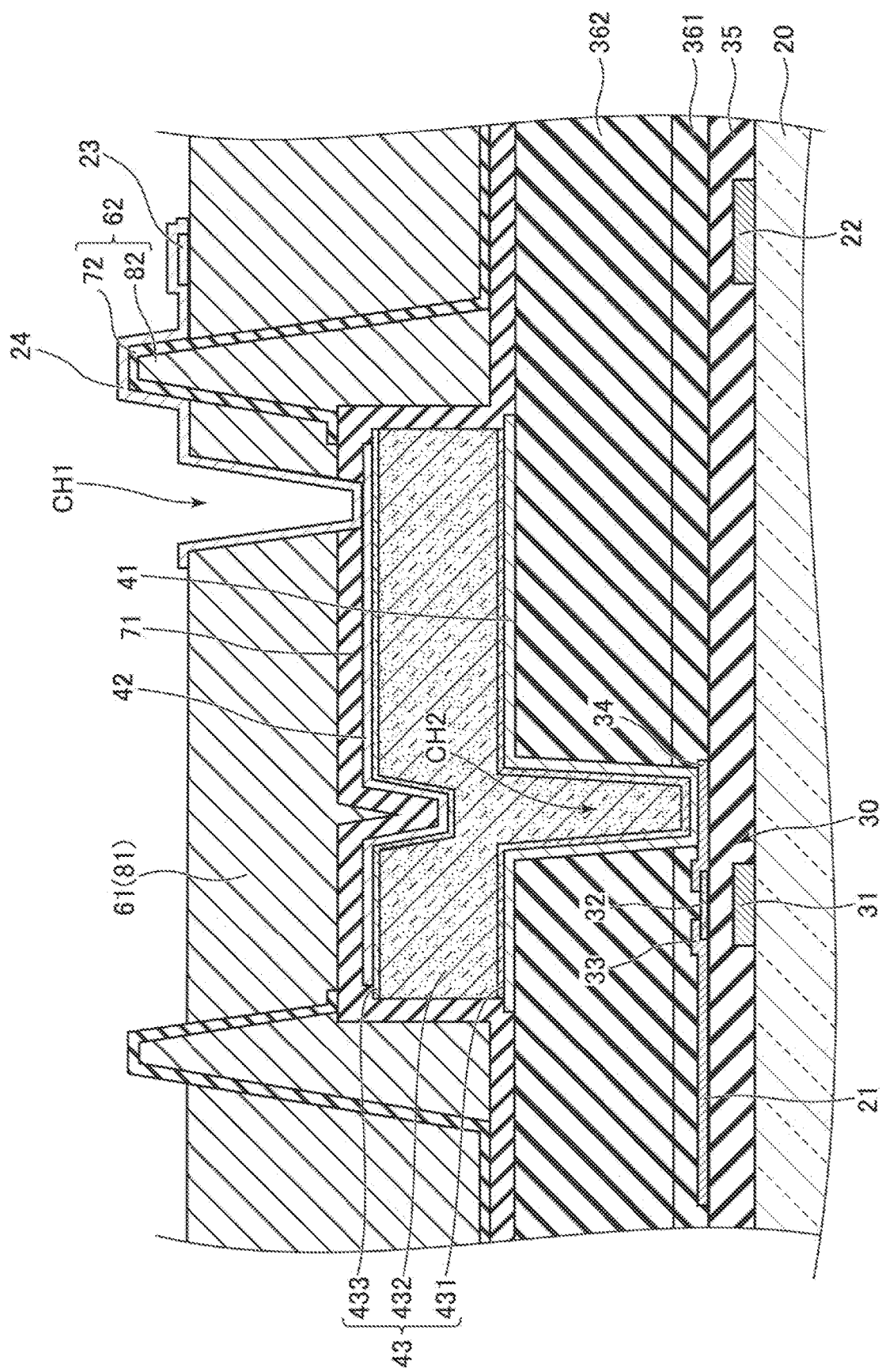
FIG. 5K is a cross-sectional view illustrating a process for producing the photoelectric conversion device according to the first embodiment.
Figure 5L:
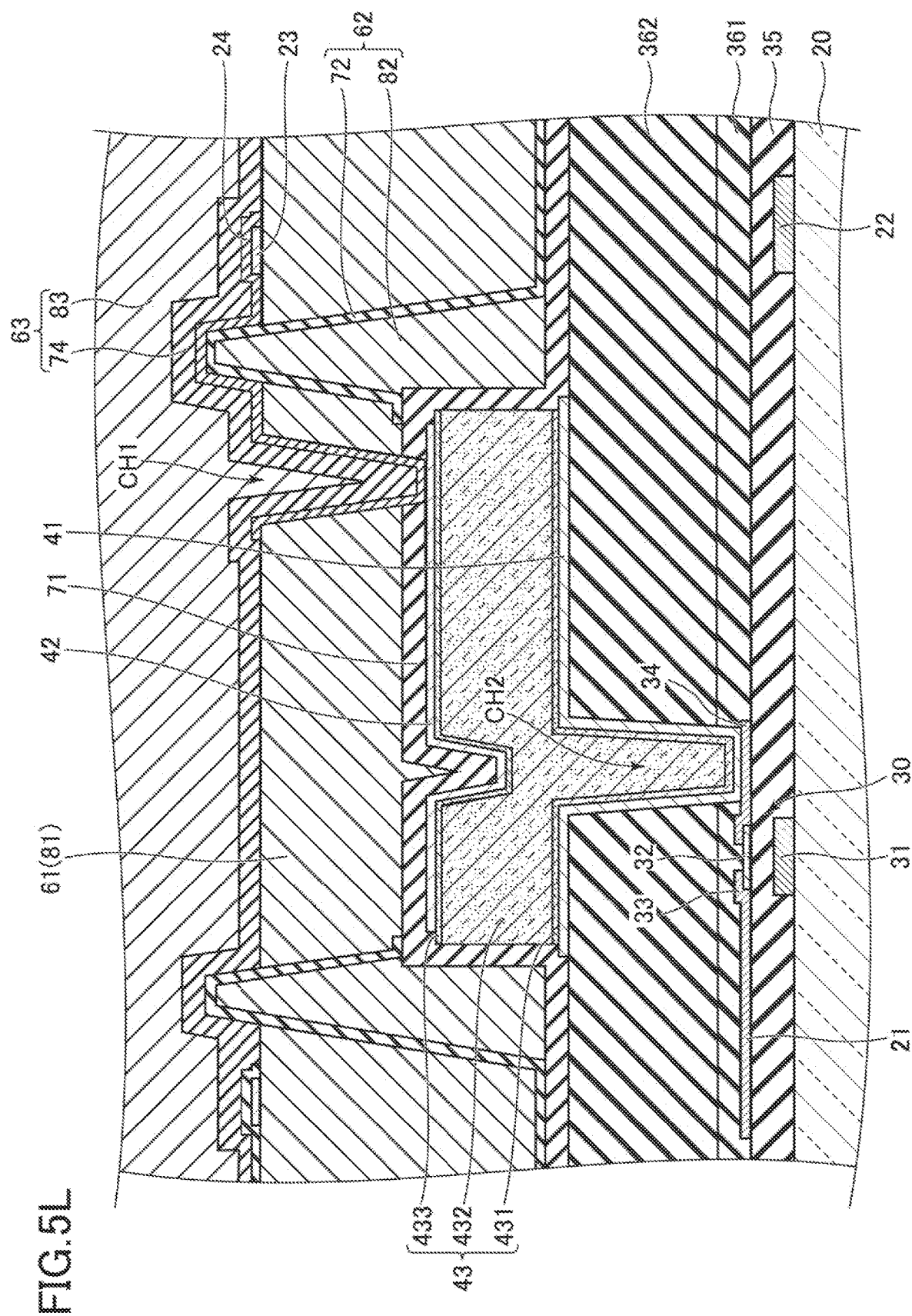
FIG. 5L is a cross-sectional view illustrating a process for producing the photoelectric conversion device according to the first embodiment.

FIG. 4 is a cross-sectional view taken along line IV-IV in FIG. 3. As illustrated in FIG. 4, the TFT 30 of this embodiment includes: the TFT 30; a gate electrode 31; a semiconductor layer 32; a source electrode 33; and a drain electrode 34.

The gate electrode 31 and the gate wire 22 are provided on the substrate 20. The gate electrode 31 is formed of a portion of the gate wire 22. The gate electrode 31 and the gate wire 22 connect to each other. The gate electrode 31 and the gate wire 22 are each formed of a multilayer including a lower metal film containing titanium (Ti) and an upper metal film containing copper (Cu). Note that the gate electrode 31 and the gate wire 22 may each be formed of a multilayer including a lower metal film containing aluminum (Al) and an upper metal film containing molybdenum nitride (MoN). In this embodiment, the lower metal film has a film thickness of approximately 300 nm and the upper metal film has a film thickness of approximately 100 nm. Note that the materials and the film thicknesses of the gate electrode 31 and the gate wire 22 shall not be limited as such.

Provided on the gate electrode 31 is a gate insulating film 35. The gate insulating film 35 is formed of, for example, an inorganic insulating film containing, for example, such a substance as silicon oxide ($SiO_x$), silicon nitride (SiN), silicon oxide nitride ($SiO_xN_y$ where x>y), and silicon nitride oxide ($SiN_xO_y$ where x>y). The gate insulating film 35 of this embodiment is formed of a multilayer including a lower inorganic insulating film containing silicon nitride ($SiN_x$) and an upper inorganic insulating film containing silicon oxide ($SiO_x$). In this embodiment, the lower inorganic insulating film has a film thickness of approximately 50 nm and the upper inorganic insulating film has a film thickness of approximately 400 nm. Note that the materials and the film thickness of the gate insulating film 35 shall not be limited as such.

The semiconductor layer 32 of this embodiment is formed of oxide semiconductor. The oxide semiconductor is, for example, amorphous semiconductor containing such substances as $InGaO_3(ZnO)_5$, magnesium zinc oxide ($Mg_xZn_yO$), cadmium zinc oxide ($Cd_xZn_yO$), cadmium oxide (CdO), or indium (In), gallium (Ga), and zinc (Zn) at a predetermined ratio. The semiconductor layer 32 of this embodiment has a film thickness of approximately 70 nm. Note that the materials and the film thickness of the semiconductor layer 32 shall not be limited as such.

The source electrode 33 and the drain electrode 34 are provided on the same layer. Specifically, the source electrode 33 and the drain electrode 34 are provided on the gate insulating film 35 to come into contact with a portion of the semiconductor layer 32. The source electrode 33 is formed of a portion of the source wire 21. The source electrode 33 and the source wire 21 connect to each other. The source electrode 33 and the drain electrode 34 of this embodiment are each formed of a multilayer including three films; that is, for example, a metal film containing molybdenum nitride (MoN), a metal film containing aluminum (Al), and a metal film containing titanium (Ti) stacked on top of another in the stated order from the substrate 20. Each of these three films of this embodiment has a film thickness of approximately 50 nm, 100 nm, and 500 nm in the stated order from the substrate 20. Note that the materials and the film thicknesses of the source electrode 33 and the drain electrode 34 shall not be limited as such.

A first insulating film 361 is provided above the semiconductor layer 32, the source electrode 33, and the drain electrode 34. The first insulating film 361 is formed of, for example, an inorganic insulating film containing silicon nitride ($SiN_x$). The first insulating film 361 of this embodiment has a film thickness of approximately 330 nm. Note that the material and the film thickness of the first insulating film 361 shall not be limited as such. The first insulating film 361 has a region overlapping the drain electrode 34 in top view and provided with an opening.

Provided on the first insulating film 361 is a second insulating film 362. The second insulating film 362 is formed of such a transparent resin as, for example, an acryl-based resin, a siloxane-based resin, or a polyimide-based resin. The second insulating film 362 of this embodiment has a film thickness of approximately 2.5 μm. Note that the materials and the film thicknesses of the first insulating film 361 and the second insulating film 362 shall not be limited as such. The second insulating film 362 of this embodiment also functions as a planarization film to cover asperities on, and to planarize, the substrate 20.

The second insulating film 362 has a region overlapping the drain electrode 34 in top view and provided with an opening. The openings provided to the first insulating film 361 and the second insulating film 362 form a contact hole CH2.

As can be seen, the TFT 30 of this embodiment is a bottom-gate TFT having the gate electrode 31 provided toward the substrate 20 with respect to the semiconductor layer 32 (i.e. provided below the semiconductor layer 32). Note that the TFT 30 may be: a top-gate TFT having the gate electrode 31 provided across the semiconductor layer 32 from the substrate 20 (provided above the semiconductor layer 32); or a double-gate TFT having the gate electrode 31 provided to a layer toward the substrate 20 with respect to the semiconductor layer 32 (provided below the semiconductor layer 32) and to a layer across the semiconductor layer 32 from the substrate 20 (provided above the semiconductor layer 32).

The semiconductor layer 32, the source electrode 33, and the drain electrode 34 may be integrally formed together of a single semiconductor material. Specifically, the semiconductor layer 32, the source electrode 33, and the drain electrode 34 may be, for example, integrally formed together of a single oxide semiconductor. In this case, the source electrode 33 and the drain electrode 34 are at least partially reduced in resistance. Hence, the source electrode 33 and the drain electrode 34 may be formed as low-resistance semiconductors higher in electrical conductivity than the semiconductor layer 32.

The photoelectric conversion element 40 is provided above the substrate 20. Specifically, as illustrated in FIG. 2, the photoelectric conversion element 40 of this embodiment includes a plurality of photoelectric conversion elements 40 provided above the substrate 20 and arranged in a matrix. As illustrated in FIG. 4, each of the photoelectric conversion elements 40 of this embodiment includes: a lower electrode 41; an upper electrode 42; and a photoelectric conversion layer 43 provided between the lower electrode 41 and the upper electrode 42.

The lower electrode 41 is provided on the second insulating film 362, and electrically connected to the drain electrode 34 through the contact hole CH2. The lower electrode 41 is formed of, for example, a metal film containing molybdenum nitride (MoN). The lower electrode 41 of this embodiment has a film thickness of approximately 200 nm. Note that the material and the film thickness of the lower electrode 41 shall not be limited as such.

The photoelectric conversion layer 43 of this embodiment includes: an n-type semiconductor layer 431; an i-type semiconductor layer 432; and a p-type semiconductor layer 433 stacked on top of another in the stated order from the substrate 20. The n-type semiconductor layer 431 is provided on the lower electrode 41. The n-type semiconductor layer 431 contains, for example, an amorphous silicon doped with such n-type impurities as phosphorus (P). The n-type semiconductor layer 431 of this embodiment has a film thickness of approximately 30 nm. Note that the material and the film thickness of the n-type semiconductor layer 431 shall not be limited as such.

The i-type semiconductor layer 432 is provided on, and in contact with, the n-type semiconductor layer 431. The i-type semiconductor layer 432 contains i-type amorphous silicon. That is, the i-type semiconductor layer 432 contains genuine amorphous silicon. The i-type semiconductor layer 432 of this embodiment has a film thickness of approximately 1000 nm. Note that the material and the film thickness of the i-type semiconductor layer 432 shall not be limited as such.

The p-type semiconductor layer 433 is provided on, and in contact with, the i-type semiconductor layer 432. The p-type semiconductor layer 433 contains, for example, amorphous silicon doped with such p-type impurities as boron (B). The p-type semiconductor layer 433 of this embodiment has a film thickness of approximately 5 nm. Note that the material and the film thickness of the p-type semiconductor layer 433 shall not be limited as such.

The upper electrode 42 is provided on the p-type semiconductor layer 433. The upper electrode 42 is formed of such a transparent conductive material as indium tin oxide (ITO). The upper electrode 42 has a film thickness of approximately 70 nm. Note that the material and the film thickness of the upper electrode 42 shall not be limited as such.

As illustrated in FIGS. 2 to 4, the first protective layer 61 is provided on the photoelectric conversion element 40. On the first protective layer 61, the bias wire 23 is provided as a wire layer. Specifically, the bias wire 23 is provided on the first protective layer 61 not to overlap the photoelectric conversion element 40 in top view. Such a feature makes it possible to keep the bias wire 23 from blocking the scintillation light entering the photoelectric conversion element 40. Consequently, the feature allows the scintillation light to efficiently enter the photoelectric conversion element 40.

The first protective layer 61 has a region overlapping the upper electrode 42 in top view and provided with an opening. The opening forms a contact hole CH1. The upper electrode 42 and the bias wire 23 are electrically connected together with the connector 24 through the contact hole CH1. The connector 24 is formed of, for example, such a transparent conductive material as ITO. Note that specific configurations of the first protective layer 61 and the second protective layer 62 will be described later.

When the X-ray source 2 emits an X-ray, the controller 50 applies a predetermined voltage (a bias voltage) to the bias wire 23. The X-ray emitted from the X-ray source 2 passes through the subject S and enters the scintillator 3. The X-ray entering the scintillator 3 is converted into scintillation light, and the converted scintillation light enters the photoelectric conversion device 10. The scintillation light entering the photoelectric conversion device 10 is converted by the photoelectric conversion element 40 into charges depending on an amount of the light. A signal based on the charges converted by the photoelectric conversion element 40 is read to the signal reader 51 through the source wire 21 when the TFT 30 is ON in accordance with a gate voltage output from the gate controller 52 through the gate wire 22. After that, the controller 50 generates an X-ray image in accordance with the read signal.

Described next are specific configurations of the first protective layer 61 and the second protective layer 62. As illustrated in FIG. 4, the photoelectric conversion device 10 of this embodiment further includes an inorganic insulating layer 70 provided on the photoelectric conversion element 40. The first protective layer 61 includes a first resin layer 81.

The inorganic insulating layer 70 of this embodiment includes a first inorganic insulating layer 71 covering a side face and an upper face of the photoelectric conversion element 40. Specifically, the first inorganic insulating layer 71 is provided above the second insulating film 362, and continuously covers the side face and the upper face of the photoelectric conversion element 40. The first resin layer 81 is provided on the first inorganic insulating layer 71. Specifically, the first resin layer 81 is provided in a region surrounded with the second protective layer 62, and covers an upper face of the first inorganic insulating layer 71. Hence, even if foreign objects including oxygen and water enter from a defect developed on a surface of the photoelectric conversion device 10 and reach the inside of the photoelectric conversion device 10, these features make it possible to keep the foreign objects from further reaching the photoelectric conversion element 40. Note that the first inorganic insulating layer 71 of this embodiment is formed of an inorganic insulating film containing silicon nitride ($SiN_x$). Furthermore, the first inorganic insulating layer 71 of this embodiment has a film thickness of approximately 300 nm.

The first resin layer 81 is formed of such a transparent resin as, for example, an acryl-based resin, a siloxane-based resin, or a polyimide-based resin. The first resin layer 81 of this embodiment has a film thickness of approximately 2.0 μm. Such features make it possible to keep the first inorganic insulating layer 71 from developing a defect. Moreover, the features make it possible to increase clearances between the bias wire 23 and the source wire 21 and between the bias wire 23 and the gate wire 22, and to keep the photoelectric conversion element 40 from producing parasitic capacitance. Note that the first resin layer 81 of this embodiment also functions as a planarization film to cover asperities on, and to planarize, the second insulating film 362.

The second protective layer 62 is provided above the substrate 20, and surrounds the photoelectric conversion element 40 and the first protective layer 61. Specifically, as illustrated in FIGS. 2 to 4, the second protective layer 62 of this embodiment is provided above the substrate 20, and surrounds each of the photoelectric conversion elements 40. Moreover, as illustrated in FIG. 4, the second protective layer 62 has an upper end positioned above an upper end of the first protective layer 61. The second protective layer 62 of this embodiment includes a second resin layer 82 and a second inorganic insulating layer 72.

The second resin layer 82 is provided above the second insulating film 362 to surround the photoelectric conversion element 40 and the first protective layer 61. Specifically, the second resin layer 82 is provided on the first inorganic insulating layer 71 covering an upper face of the second insulating film 362. The second resin layer 82 is formed of such a transparent resin as, for example, an acryl-based resin, a siloxane-based resin, or a polyimide-based resin. The second resin layer 82 of this embodiment has a film thickness of approximately 3.5 μm.

The second inorganic insulating layer 72 at least partially covers a surface of the second resin layer 82. Specifically, the second inorganic insulating layer 72 is continuously provided to cover (i) the first inorganic insulating layer 71 covering the upper face of the second insulating film 362, and (ii) the surface of the second resin layer 82. The second inorganic insulating layer 72 is formed of, for example, an inorganic insulating film containing silicon nitride ($SiN_x$). The second inorganic insulating layer 72 of this embodiment has a film thickness of approximately 150 nm. Note that the second inorganic insulating layer 72 may have a film thickness of approximately 300 nm.

Moreover, the second inorganic insulating layer 72 has a region overlapping the upper electrode 42 in top view and provided with an opening. That is, the second inorganic insulating layer 72 is provided not to overlap the upper electrode 42 in top view. Such features make it possible to keep the second inorganic insulating layer 72 from blocking the scintillation light entering the photoelectric conversion element 40.

Furthermore, in this embodiment, a side face of the second protective layer 62 and the first inorganic insulating layer 71 covering the side face of the photoelectric conversion element 40 are in contact with each other. Specifically, a side face of the second resin layer 82 and the first inorganic insulating layer 71 covering the side face of the photoelectric conversion element 40 are in contact with each other. Such features make it possible to reduce, in the photoelectric conversion device 10, a space required to install the second protective layer 62.

Here, the second protective layer 62 is lower in water vapor transmittance than the first protective layer 61. Specifically, the first resin layer 81 included in the first protective layer 61 and made of transparent resin is lower in water vapor transmittance than the second inorganic insulating layer 72 included in the second protective layer 62 and made of silicon nitride ($SiN_x$). Note that the water vapor transmittance can be measured by, for example, equal pressure and differential pressure.

Note that, the film thickness of the second protective layer 62 shall not be limited to the above film thickness as long as the upper end of the second protective layer 62 is positioned above the first protective layer 61. Moreover, the materials of the first protective layer 61 and the second protective layer 62 shall not be limited to the above materials as long as the second protective layer 62 includes a layer lower in water vapor transmittance than the first protective layer 61.

Furthermore, the photoelectric conversion device 10 of this embodiment further includes a third protective layer 63 integrally formed to cover an upper face of the first protective layer 61 and the upper end of the second protective layer 62. In addition, the third protective layer 63 of this embodiment includes a fourth inorganic insulating layer 74 integrally formed to cover the upper face of the first protective layer 61 and the upper end of the second protective layer 62. The third protective layer 63 of this embodiment further includes a third resin layer 83 provided on the fourth inorganic insulating layer 74.

The fourth inorganic insulating layer 74 is integrally formed to cover the upper face of the first protective layer 61 and the upper end of the second protective layer 62. Specifically, the fourth inorganic insulating layer 74 of this embodiment is integrally formed to cover an upper face of the first resin layer 81 in the first protective layer 61, and the second inorganic insulating layer 72 in the second protective layer 62 protruding above the first resin layer 81. The fourth inorganic insulating layer 74 is formed of, for example, an inorganic insulating film containing silicon nitride (SiN). The fourth inorganic insulating layer 74 of this embodiment has a film thickness of approximately 300 nm.

The third resin layer 83 is provided on the fourth inorganic insulating layer 74. Specifically, the third resin layer 83 of this embodiment is integrally formed to cover an upper face of the fourth inorganic insulating layer 74. The third resin layer 83 is formed of such a transparent resin as, for example, an acryl-based resin, a siloxane-based resin, or a polyimide-based resin. The third resin layer 83 of this embodiment has a film thickness of approximately 2.0 μm.

As can be seen, the photoelectric conversion device 10 of this embodiment includes: the substrate 20; the photoelectric conversion element 40 provided on the substrate 20; the first protective layer 61 provided on the photoelectric conversion element 40; and the second protective layer 62 provided above the substrate 20 and surrounding the photoelectric conversion element 40 and the first protective layer 61. The second protective layer 62 is lower in water vapor transmittance than the first protective layer 61. The second protective layer 62 has an upper end positioned above an upper end of the first protective layer 61. These features make it possible to keep such foreign objects as oxygen and water from diffusing from the first protective layer 61 into the second protective layer 62. Hence, even if the first protective layer 61 develops a defect, the features make it possible to keep such foreign objects as oxygen and water from diffusing into adjoining photoelectric conversion elements 40. Consequently, the features can reduce deterioration of a photoelectric conversion element 40 spreading among two or more of the photoelectric conversion elements 40, making it possible to improve reliability of the photoelectric conversion device 10.

The photoelectric conversion device 10 of this embodiment further includes an inorganic insulating layer 70 provided on the photoelectric conversion element 40. The first protective layer 61 includes a first resin layer 81. The inorganic insulating layer 70 includes the first inorganic insulating layer 71 covering a side face and an upper face of the photoelectric conversion element 40, and the first resin layer 81 is provided on the first inorganic insulating layer 71. These features make it possible to keep such foreign objects as oxygen and water from reaching the inside of the photoelectric conversion element 40. Consequently, the features can reduce current leakage in the photoelectric conversion element 40, making it possible to reduce a decrease in detection accuracy of the photoelectric conversion device 10. Furthermore, the inorganic insulating layer 70 is covered with, and protected by, the first resin layer 81. Such a feature makes it possible to keep a defect from developing on the inorganic insulating layer 70 during and after the production process of the photoelectric conversion device 10. Consequently, the feature makes it possible to keep such foreign objects as oxygen and water from reaching the inside of the photoelectric conversion element 40.

The second protective layer 62 of this embodiment includes the second inorganic insulating layer 72 covering the second resin layer 82, and at least partially covering a surface of the second resin layer 82. Hence, even if such foreign objects as oxygen and water reach the inside of the first protective layer 61, this feature makes it possible to keep the foreign objects from diffusing into the second protective layer 62. Consequently, the feature makes it possible to keep such foreign objects as oxygen and water from diffusing into adjoining photoelectric conversion elements 40.

The photoelectric conversion device 10 of this embodiment further includes the third protective layer 63 integrally formed to cover an upper face of the first protective layer 61 and the upper end of the second protective layer 62. The third protective layer 63 of this embodiment includes the fourth inorganic insulating layer 74 integrally formed to cover the upper face of the first protective layer 61 and the upper end of the second protective layer 62. Such features make it possible to keep such foreign objects as oxygen and water from reaching the inside of the photoelectric conversion element 40. Consequently, the features make it possible to further improve reliability of the photoelectric conversion device 10.

The third protective layer 63 of this embodiment further includes a third resin layer 83 provided on the fourth inorganic insulating layer 74. Such a feature makes it possible to keep a defect from developing on a layer below the third resin layer 83 during and after the production process of the photoelectric conversion device 10. Consequently, the feature makes it possible to keep such foreign objects as oxygen and water from reaching the inside of the photoelectric conversion element 40, and to further improve reliability of the photoelectric conversion device 10.

Furthermore, the connector 24 of this embodiment is in contact with the inorganic insulating layer 70 in the contact hole CH1. Specifically, as illustrated in FIG. 4, the connector 24 of this embodiment is provided to come into contact with the first inorganic insulating layer 71 in the contact hole CH1. More specifically, the first inorganic insulating layer 71 is exposed to an inside face of the contact hole CH1. The connector 24 is provided to cover the inside face of the contact hole CH1. These features make it possible to keep such foreign objects as oxygen and water from reaching the inside of the photoelectric conversion element 40 through the contact hole CH1. Consequently, the features can further improve reliability of the photoelectric conversion device 10.

Moreover, the second protective layer 62 of this embodiment has a horizontal width in cross-section narrower upwards from the substrate 20. That is, the second protective layer 62 of this embodiment has a side face tapered with respect to the substrate 20. In other words, in this embodiment, an angle formed between an outward side face of the second protective layer 62 and the substrate 20 is larger than 90°.

Specifically, the second resin layer 82 included in the second protective layer 62 has a horizontal width in cross-section narrower upwards from the substrate 20. The second inorganic insulating layer at least partially covers a surface of the second resin layer 82. These features make it possible to reduce the risk of a defect developing on a layer above the second protective layer 62, and to keep such foreign objects as oxygen and water from reaching the inside of the photoelectric conversion element 40. Consequently, the features can further improve reliability of the photoelectric conversion device 10. Furthermore, the features make it possible to keep the second protective layer 62 from blocking the scintillation light entering the photoelectric conversion element 40.

Described next is how to produce the photoelectric conversion device 10. FIGS. 5A to 5L are cross-sectional views each illustrating a production step of the photoelectric conversion device 10.

In producing the photoelectric conversion device 10 of this embodiment, first, the gate insulating film 35 and the TFT 30 are formed, using known techniques. (See FIG. 5A.)

Next, an inorganic insulating film containing silicon nitride ($SiN_x$) is formed by, for example, the plasma chemical vapor deposition (CVD). After that, the inorganic insulating film is patterned by, for example, photolithography and by dry-etching using a fluorine gas. (See FIG. 5B.) Hence, the first insulating film 361 is formed to have an opening above the drain electrode 34.

Next, a resin film containing an acryl-based resin, a siloxane-based resin, or a polyimide-based resin is formed by, for example, slit-coating. After that, the resin film is patterned by, for example, photolithography. (See FIG. 5C.) Hence, the second insulating film 362 is formed to have an opening overlapping the opening of the first insulating film 361 in top view, and the openings of the first insulating film 361 and the second insulating film 362 form the contact hole CH2.

Next, a metal film containing molybdenum nitride (MoN) is deposited, by, for example, sputtering. The deposited metal film is patterned by photolithography and wet-etching. Hence, on the second insulating film 362, the lower electrode 41 is formed to connect to the drain electrode 34 through the contact hole CH2. (See FIG. 5D.)

Next, a layer 431A containing an n-type semiconductor, a layer 432A containing an i-type semiconductor, and a layer 433A containing a p-type semiconductor are deposited in the stated order, by, for example, the plasma CVD. After that, a transparent conductive film containing ITO is deposited by, for example, sputtering on the layer 433A containing the p-type semiconductor. The deposited transparent conductive film is patterned by, for example, photolithography and dry-etching. (See FIG. 5E.) Hence, the upper electrode 42 is formed on the layer 433A containing the p-type semiconductor.

Next, the layer 431A containing the n-type semiconductor, the layer 432A containing the i-type semiconductor, and the layer 433A containing the p-type semiconductor are patterned by, for example, photolithography and dry-etching. (See FIG. 5F.) Hence, the photoelectric conversion layer 43 including the n-type semiconductor layer 431, the i-type semiconductor layer 432, and the p-type semiconductor layer 433 is formed in a region overlapping the lower electrode 41 in top view.

Next, the first inorganic insulating layer 71 containing silicon nitride ($SiN_x$) is deposited by, for example, the plasma CVD. (See FIG. 5G.)

Next, a resin film containing an acryl-based resin, a siloxane-based resin, or a polyimide-based resin is formed by, for example, slit-coating. After that, the resin film is patterned by, for example, photolithography. (See FIG. 5H.) Hence, the second resin layer 82 is formed.

Next, an inorganic insulating film containing silicon nitride ($SiN_x$) is deposited by, for example, the plasma CVD. After that, the inorganic insulating film is patterned by, for example, photolithography and dry-etching. (See FIG. 5I.) Hence, the second inorganic insulating layer 72 is formed to at least partially cover the second resin layer 82 and to have an opening in a region overlapping the upper electrode 42 in top view.

Next, a resin film containing an acryl-based resin, a siloxane-based resin, or a polyimide-based resin is formed by, for example, slit-coating. After that, the resin film is patterned by, for example, photolithography. (See FIG. 5J.) Hence, the first resin layer 81 is formed to be surrounded with the second protective layer 62 and included in the first protective layer 61. Note that the first resin layer 81 may be formed of droplets containing an acryl-based resin, a siloxane-based resin, or a polyimide-based resin, and applied by, for example, ink-jet printing.

Next, the first resin layer 81 is patterned by, for example, photolithography. Hence, the first resin layer 81 has an opening formed to overlap the opening of the first inorganic insulating film 71 in top view, and the openings of the first inorganic insulating film 71 and the first resin layer 81 form the contact hole CH1. Next, a metal film is deposited by, for example, sputtering molybdenum nitride (MoN), aluminum (Al), and titanium (Ti) multilayered on top of another in the stated order. After that, the deposited metal film is patterned by, for example, photolithography and wet-etching. Hence, the bias wire 23 is formed on the first resin layer 81. After that, a transparent conductive film containing ITO is deposited by, for example, sputtering. After that, the transparent conductive film is patterned by, for example, photolithography and dry-etching. (See FIG. 5K.) Hence, the connector 24 is formed to connect to the bias wire 23 and to the upper electrode 42 through the contact hole CH1.

After that, the fourth inorganic insulating layer 74 containing silicon nitride ($SiN_x$) is deposited by, for example, the plasma CVD. After that, the third resin layer 83 containing an acryl-based resin, a siloxane-based resin, or a polyimide-based resin is formed by, for example, slit-coating. (See FIG. 5L.) This is how the photoelectric conversion device 10 according to this embodiment is produced.

Second Embodiment

Next, a second embodiment is described. Mainly described below are differences between the second embodiment and the first embodiment, and details overlapping those of the first embodiment shall be omitted. Note that the second embodiment is different in configuration of the inorganic insulating layer 70 from the first embodiment.

Figure 6:
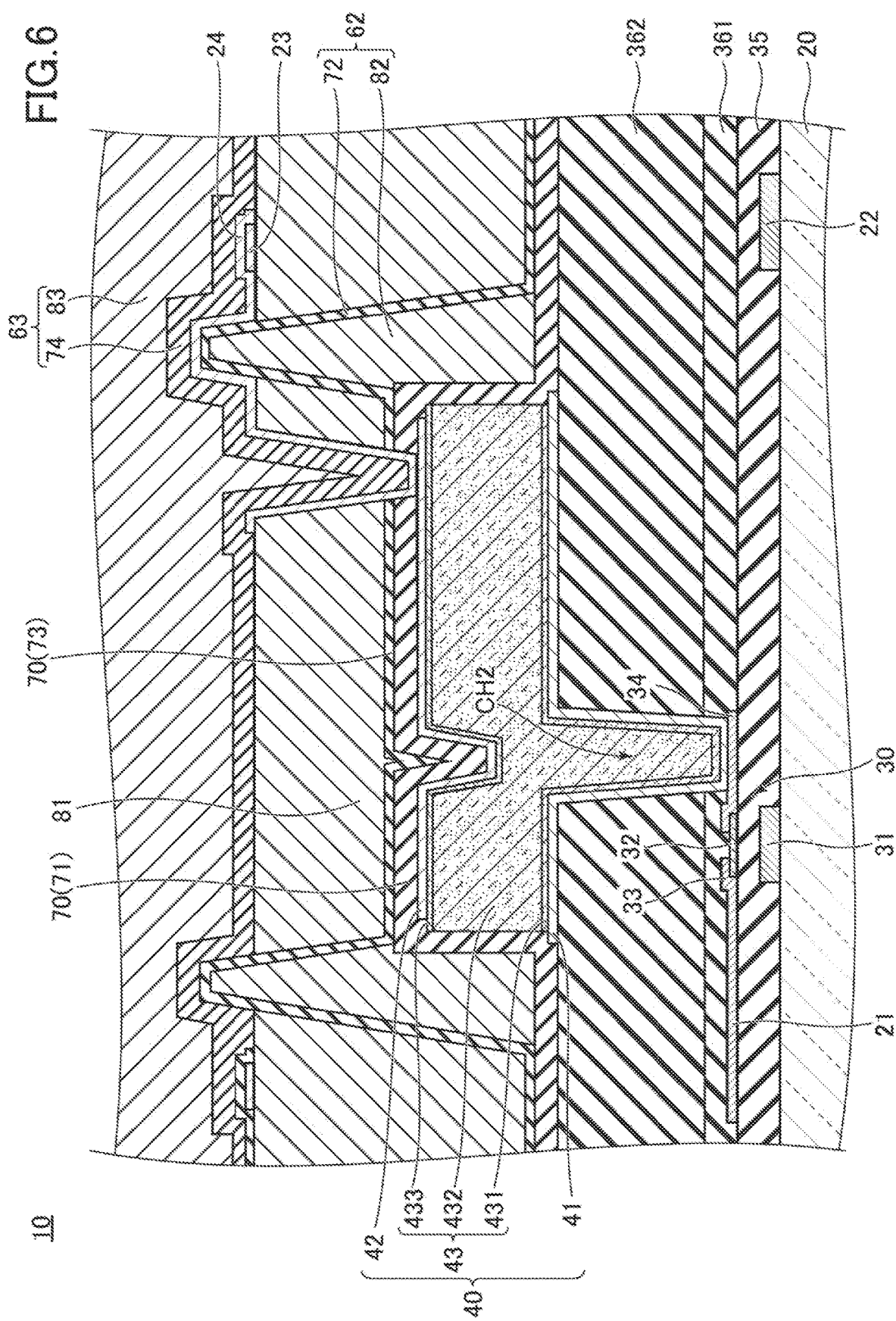
FIG. 6 is a cross-sectional view illustrating a configuration of and around a photoelectric conversion element according to a second embodiment.

FIG. 6 is a cross-sectional view illustrating a configuration of and around the photoelectric conversion element 40 according to this embodiment. As illustrated in FIG. 6, the first protective layer 61 of this embodiment includes the first resin layer 81 stacked above the photoelectric conversion element 40. The inorganic insulating layer 70 of this embodiment further includes a third inorganic insulating layer 73 provided on the photoelectric conversion element 40. Specifically, the third resin layer 73 is integrally formed together with the second inorganic insulating layer 72. The third inorganic insulating layer 73 is formed of, for example, an inorganic insulating film containing silicon nitride ($SiN_x$). The third inorganic insulating layer 73 of this embodiment has a film thickness of approximately 150 nm.

More specifically, the inorganic insulating layer 70 of this embodiment includes: the first inorganic insulating layer 71 covering the side face and the top face of the photoelectric conversion element 40; and the third inorganic insulating layer 73 provided on the first inorganic insulating layer 71. The first resin layer 81 is provided on the third inorganic insulating layer 73. The third inorganic insulating layer 73 is integrally formed together with the second inorganic insulating layer 72 at least partially covering a surface of the second resin layer 82. Such features make it possible to cover the photoelectric conversion element 40 with the inorganic insulating layer insulating layer 70 formed thick. Hence, the features make it possible to keep such foreign objects as oxygen and water from reaching the photoelectric conversion element 40. Consequently, the features can further improve reliability of the photoelectric conversion device 10.

Furthermore, the connector 24 of this embodiment is in contact with the inorganic insulating layer 70 in the contact hole CH1. Specifically, as illustrated in FIG. 6, the connector 24 of this embodiment is provided to come into contact with the first inorganic insulating layer 71 and the third inorganic insulating layer 73 in the contact hole CH1. More specifically, the first inorganic insulating layer 71 and the third inorganic insulating layer 73 are exposed to the inside face of the contact hole CH1. The connector 24 is provided to cover the inside face of the contact hole CH1. These features make it possible to keep such foreign objects as oxygen and water from reaching the inside of the photoelectric conversion element 40 through the contact hole CH1. Consequently, the features can further improve reliability of the photoelectric conversion device 10.

Note that, after the formation of the second resin layer 82, the third inorganic insulating layer 73 of this embodiment can be formed of, for example, an inorganic insulating film containing silicon nitride ($SiN_x$) and deposited by the plasma CVD. That is, the second inorganic insulating layer 72 and the third inorganic insulating layer 73 can be formed simultaneously. In other words, the second embodiment can omit the step for patterning the second inorganic insulating layer 72 in the first embodiment. Hence, this embodiment can simplify the steps for producing the photoelectric conversion device 10.

<Modifications>

Described above are main embodiments of the disclosure; however, the disclosure shall not be limited to the above embodiments.

In the above embodiments, the photoelectric conversion device 10 is used for the X-ray imaging device 1. However, the photoelectric conversion device 10 may be used for, for example, other products such as an image sensor. Other than the scintillator 3, a member having an optical function such as a color filter may be provided on the photoelectric conversion device 10.

The above embodiments describe an example in which the photoelectric conversion device 10 forms an image in accordance with scintillation light. However, the photoelectric conversion device 10 of the disclosure is applicable in the case where the image is formed in accordance with another kind of light such as visible light.

In the above embodiments, the second protective layer 62 is provided to surround each of the photoelectric conversion elements 40. However, the second protective layer 62 may be provided to surround at least one of the photoelectric conversion elements 40.

In the above embodiments, the photoelectric conversion layer 43 of the photoelectric conversion element 40 includes the n-type semiconductor layer 431, the i-type semiconductor layer 432, and the p-type semiconductor layer 433 stacked on top of another in the stated order from the substrate 20. However, the photoelectric conversion layer 43 may include the p-type semiconductor layer 433, the i-type semiconductor layer 432, and the n-type semiconductor layer 431 stacked on top of another in the stated order from the substrate 20.

In the above embodiments, the photoelectric conversion layer 43 includes the n-type semiconductor layer 431 containing the n-type amorphous silicon, the i-type semiconductor layer 432 containing the i-type amorphous silicon, and the p-type semiconductor layer 433 containing the p-type amorphous silicon. However, the photoelectric conversion layer 43 of the disclosure shall not be limited to such a photoelectric conversion layer. The photoelectric conversion layer 43 of the disclosure may be formed of, for example, such a material as an organic semiconductor material.

The above embodiments describe an example in which each of the first protective layer 61, the second protective layer 62, and the third protective layer 63 includes an inorganic insulating film containing silicon nitride ($SiN_x$). However, the configuration of each of the protective layers in the disclosure shall not be limited to such a configuration. Instead of an inorganic insulating film containing silicon nitride ($SiN_x$), each protective layer may include an inorganic insulating film containing, for example, such a substance as silicon oxide ($SiO_x$), silicon oxide nitride ($SiO_xN_y$ where x>y), silicon nitride oxide ($SiN_xO_y$ where x>y), and aluminum oxide ($Al_xO_y$).

Moreover, instead of the inorganic insulating layer 70, each protective layer may include a layer formed of, for example, such a substance as titanium oxide (TiO), titanium nitride (TiN), titanium (Ti), molybdenum niobium oxide (MoNbO), molybdenum niobium nitride (MoNbN), molybdenum niobium (MoNb), tungsten (W), and tantalum (Ta). Each protective layer may also include a layer formed of a transparent conductive film such as In—Zn—O (IZO) or In—Ga—Zn—O (IGZO).

The first protective layer 61 of the above embodiments includes the first resin layer 81 and the inorganic insulating layer 70. The second protective layer 62 of the above embodiments includes the second resin layer 82 and the second inorganic insulating layer 72. However, the configurations of the first protective layer 61 and the second protective layer 62 in the disclosure shall not be limited to such configurations. The first protective layer 61 and the second protective layer 62 may have any given configuration as long as the second protective layer 62 is lower in water vapor transmittance than the first protective layer 61. For example, the first protective layer 61 may be formed only of a resin layer, and the second protective layer 62 may be formed only of an inorganic insulating layer.

In the above embodiments, the photoelectric conversion device 10 includes the third protective layer 63. The third protective layer 63 includes the fourth inorganic insulating layer 74 and the third resin layer 83. However, the resin layer and the inorganic insulating layer included in the third protective layer 63 may be partially or entirely omitted. Such a feature can simplify the steps for producing the photoelectric conversion device 10.

The elements introduced in the embodiments and the modifications may be appropriately combined as long as the combinations have no inconsistencies.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A photoelectric conversion device, comprising:
a substrate;
a photoelectric conversion element provided on the substrate;
a first protective layer provided on the photoelectric conversion element; and
a second protective layer provided above the substrate and shaped into a bank surrounding, in plan view, a portion of the second protective layer other than portions above the photoelectric conversion element and the first protective layer, the second protective layer being lower in water vapor transmittance than the first protective layer, the second protective layer having an upper end positioned above an upper end of the first protective layer.

2. The photoelectric conversion device according to claim 1, further comprising:
an inorganic insulating layer provided on the photoelectric conversion element, wherein
the first protective layer includes a first resin layer.

3. The photoelectric conversion device according to claim 2, wherein
the inorganic insulating layer includes a first inorganic insulating layer covering a side face and an upper face of the photoelectric conversion element, and
the first resin layer is provided on the first inorganic insulating layer.

4. The photoelectric conversion device according to claim 2, wherein
the second protective layer includes a second inorganic insulating layer covering a second resin layer, and at least partially covering a surface of the second resin layer.

5. The photoelectric conversion device according to claim 4, wherein the inorganic insulating layer further includes a third inorganic insulating layer integrally formed together with the second inorganic insulating layer.

6. The photoelectric conversion device according to claim 2, wherein the photoelectric conversion element includes: a lower electrode; an upper electrode; and a photoelectric conversion layer provided between the lower electrode and the upper electrode, and the photoelectric conversion device further comprises:
a thin-film transistor provided on the substrate and electrically connected to the lower electrode;
a connector electrically connected to the upper electrode through a contact hole provided to the first protective layer and the inorganic insulating layer; and
a wire layer electrically connected to the connector.

7. A photoelectric conversion device, comprising:
a substrate;
a photoelectric conversion element provided on the substrate;
a first protective layer provided on the photoelectric conversion element;
an inorganic insulating layer provided on the photoelectric conversion element; and
a second protective layer provided above the substrate and shaped into a bank surrounding, in plan view, a portion of the second protective layer, other than portions above the photoelectric conversion element and the first protective layer, the second protective layer being lower in water vapor transmittance than the first protective layer, wherein:
the second protective layer has an upper end positioned above an upper end of the first protective layer,
the first protective layer includes a first resin layer,
the inorganic insulating layer includes a first inorganic insulating layer covering a side face and an upper face of the photoelectric conversion element,
the first resin layer is provided on the first inorganic insulating layer, and
a side face of the second protective layer and the first inorganic insulating layer covering the side face of the photoelectric conversion element are in contact with each other.

8. The photoelectric conversion device according to claim 7, wherein
the second protective layer includes a second inorganic insulating layer covering a second resin layer, and at least partially covering a surface of the second resin layer.

9. The photoelectric conversion device according to claim 8, wherein
the inorganic insulating layer further includes a third inorganic insulating layer integrally formed together with the second inorganic insulating layer.

10. The photoelectric conversion device according to claim 7, wherein
the photoelectric conversion element includes: a lower electrode; an upper electrode; and a photoelectric conversion layer provided between the lower electrode and the upper electrode, and
the photoelectric conversion device further comprises:
a thin-film transistor provided on the substrate and electrically connected to the lower electrode;
a connector electrically connected to the upper electrode through a contact hole provided to the first protective layer and the inorganic insulating layer; and
a wire layer electrically connected to the connector.

11. The photoelectric conversion device according to claim 10, wherein
the connector is in contact with the inorganic insulating layer in the contact hole.

12. The photoelectric conversion device according to claim 10, wherein
the photoelectric conversion layer includes: an n-type semiconductor layer; an i-type semiconductor layer; and a p-type semiconductor layer stacked on top of each other in a stated order.

13. The photoelectric conversion device according to claim 12, wherein
the n-type semiconductor layer contains n-type amorphous silicon,
the i-type semiconductor layer contains i-type amorphous silicon, and
the p-type semiconductor layer contains p-type amorphous silicon.

14. The photoelectric conversion device according to claim 7, further comprising
a third protective layer integrally formed to cover an upper face of the first protective layer and the upper end of the second protective layer.

15. The photoelectric conversion device according to claim 7, wherein
the second protective layer has a horizontal width in cross-section that narrows upward from the substrate.

16. The photoelectric conversion device according to claim 7, wherein
the photoelectric conversion element includes a plurality of photoelectric conversion elements provided above the substrate, and
the second protective layer surrounds each of the photoelectric conversion elements in top view.

17. The photoelectric conversion device according to claim 16, wherein
regions each surrounded with the second protective layer are arranged in a matrix in top view.

18. An X-ray imaging device, comprising:
the photoelectric conversion device according to claim 7; and
a scintillator provided on the photoelectric conversion device, and configured to convert an X-ray, entering the scintillator, into fluorescent light.

19. A photoelectric conversion device, comprising:
a substrate;
a photoelectric conversion element provided on the substrate;
a first protective layer provided on the photoelectric conversion element;
a second protective layer provided above the substrate and shaped into a bank surrounding, in plan view, a portion of the second protective layer, other than portions above the photoelectric conversion element and the first protective layer, the second protective layer being lower in water vapor transmittance than the first protective layer; and
a third protective layer integrally formed to cover an upper face of the first protective layer and an upper end of the second protective layer, wherein:
the upper end of the second protective layer is positioned above an upper end of the first protective layer, and the third protective layer includes an inorganic insulating layer integrally formed to cover the upper face of the first protective layer and the upper end of the second protective layer.

20. The photoelectric conversion device according to claim 19, wherein
the third protective layer further includes a resin layer provided on the inorganic insulating layer.

\* \* \* \* \*